(12) United States Patent
He et al.

(10) Patent No.: US 10,461,204 B2
(45) Date of Patent: Oct. 29, 2019

(54) DEFORMABLE PAPER ORIGAMI OPTOELECTRONIC DEVICES

(71) Applicant: KING ABDULLAH UNIVERSITY OF SCIENCE AND TECHNOLOGY, Thuwal (SA)

(72) Inventors: Jr-Hau He, Thuwal (SA); Chun-Ho Lin, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 62 days.

(21) Appl. No.: 15/741,323

(22) PCT Filed: Jul. 12, 2016

(86) PCT No.: PCT/IB2016/054159
§ 371 (c)(1),
(2) Date: Jan. 2, 2018

(87) PCT Pub. No.: WO2017/009777
PCT Pub. Date: Jan. 19, 2017

(65) Prior Publication Data
US 2018/0198009 A1    Jul. 12, 2018

Related U.S. Application Data

(60) Provisional application No. 62/191,598, filed on Jul. 13, 2015.

(51) Int. Cl.
*H01L 31/0392* (2006.01)
*G01J 1/42* (2006.01)
(Continued)

(52) U.S. Cl.
CPC ........ *H01L 31/03926* (2013.01); *G01J 1/429* (2013.01); *H01L 27/1446* (2013.01);
(Continued)

(58) Field of Classification Search
CPC .......... H01L 31/03926; H01L 27/1446; H01L 31/022408; H01L 31/1876;
(Continued)

(56) References Cited

U.S. PATENT DOCUMENTS

2013/0240837 A1    9/2013  Bandyopadhyay et al.
2014/0312332 A1*  10/2014  Lowenthal .......... H01L 51/5237
                                                                                257/40

FOREIGN PATENT DOCUMENTS

WO        2014184487 A1    11/2014

OTHER PUBLICATIONS

Aga, Jr., R.S., et al., "Performance of a Printed Photodetector on a Paper Substrate," IEEE Photonics Technology Letters, Feb. 1, 2014, vol. 26, pp. 305-308.
(Continued)

*Primary Examiner* — David P Porta
*Assistant Examiner* — Meenakshi S Sahu
(74) *Attorney, Agent, or Firm* — Patent Portfolio Builders PLLC

(57) ABSTRACT

Deformable optoelectronic devices are provided, including photodetectors, photodiodes, and photovoltaic cells. The devices can be made on a variety of paper substrates, and can include a plurality of fold segments in the paper substrate creating a deformable pattern. Thin electrode layers and semiconductor nanowire layers can be attached to the substrate, creating the optoelectronic device. The devices can be highly deformable, e.g. capable of undergoing strains of 500% or more, bending angles of 25° or more, and/or twist angles of 270° or more. Methods of making the deformable optoelectronic devices and methods of using, e.g. as a photodetector, are also provided.

20 Claims, 16 Drawing Sheets

(51) Int. Cl.
| | |
|---|---|
| H01L 27/144 | (2006.01) |
| H01L 31/0224 | (2006.01) |
| H01L 31/0352 | (2006.01) |
| H01L 31/18 | (2006.01) |
| G01J 1/44 | (2006.01) |
| H01L 31/0296 | (2006.01) |
| H01L 31/0304 | (2006.01) |
| H01L 31/0312 | (2006.01) |
| H01L 31/032 | (2006.01) |

(52) U.S. Cl.
CPC ......... *H01L 31/022408* (2013.01); *H01L 31/035227* (2013.01); *H01L 31/1876* (2013.01); *G01J 2001/4446* (2013.01); *H01L 31/0296* (2013.01); *H01L 31/032* (2013.01); *H01L 31/0312* (2013.01); *H01L 31/03044* (2013.01); *H01L 31/03048* (2013.01)

(58) Field of Classification Search
CPC ......... H01L 31/035227; H01L 31/0296; H01L 31/03048; H01L 31/0312; H01L 31/032; H01L 31/03044; G01J 1/429; G01J 2001/4446; Y02E 10/50
USPC .................................................. 250/370.14
See application file for complete search history.

(56) References Cited

OTHER PUBLICATIONS

Chen, C.-Y., et al., "Enhanced Recovery Speed of Nanostructured ZnO Photodetectors Using Nanobelt Networks," IEEE Journal of Selected Topics in Quantum Electronics, Nov./Dec. 2012, vol. 18, pp. 1807-1811.

Choi, W.M., et al., "Biaxially Stretchable "Wavy" Silicon Nanomembranes," Nano Letters, May 8, 2007, vol. 7, pp. 1655-1663.

He, J.H., et al., "Enhancing UV Photoconductivity of ZnO Nanobelt by Polyacrylonitrile Functionalization," Journal of Applied Physics, Oct. 2007, vol. 102, pp. 084303-1-084303-4.

Hsu, C.-Y., et al., "Supersensitive, Ultrafast, and Broad-Band Light-Harvesting Scheme Employing Carbon Nanotube/TiO2 Coreshell Nanowire Geometry," ACS Nano, Aug. 15, 2012, vol. 6, pp. 6687-6692.

Hung, P.J., et al., "Microfabricated Suspensions for Electrical Connections on the Tunable Elastomer Membrane," Applied Physics Letters, Dec. 13, 2004, vol. 85, No. 24, pp. 6051-6053.

Jung, I., et al., "Paraboloid Electronic Eye Cameras Using Deformable Arrays of Photodetectors in Hexagonal Mesh Layouts," Applied Physical Letters, Jan. 2010, vol. 96, 021110-1-021110-3.

Kim, D.-H., et al., "Materials and Noncoplanar Mesh Designs for Integrated Circuits with Linear Elastic Responses to Extreme Mechanical Deformations," Proceedings of the National Academy of Science U.S.A., Dec. 2, 2008, vol. 105, pp. 18675-18680.

Kim, D.-H., et al., "Stretchable and Foldable Silicon Integrated Circuits," Science, Apr. 25, 2008, vol. 320, pp. 507-511.

Kim, D.-H., et al., "Stretchable, Curvilinear Electronics Based on Inorganic Materials," Advanced Materials, Jan. 25, 2010, vol. 22, 2108-2124.

Kim, J.-Y., et al., "Paper as a Substrate for Inorganic Powder Electroluminescence Devices," IEEE Transactions on Electron Devices, Jun. 2010, vol. 57, pp. 1470-1474.

Kim, Y.-H., et al., "Organic TFT Array on a Paper Substrate," IEEE Electron Device Letters, Oct. 2004, vol. 25, pp. 702-704.

Leonat, L., et al., "4% Efficient Polymer Solar Cells on Paper Substrates," The Journal of Physical Chemistry, Apr. 16, 2014, vol. 118, pp. 16813-16817.

Li, R., et al., "An Analytical Mechanics Model for the Island-Bridge Structure of Stretchable Electronics," Soft Matter, Jul. 8, 2013, vol. 9, pp. 8476-8482.

Lien, W.-C., et al., "4H-SiC Metal-Semiconductor-Metal Ultraviolet Photodetectors in Operation of 450° C.," IEEE Electron Device Letters, Nov. 2012, vol. 33, No. 11, pp. 1586-1588.

Lien, W.-C., et al., "Low-Temperature, Ion Beam Assisted SiC Thin Films with Antireflective ZnO Nanorod Arrays for High-Temperature Photodetection," IEEE Electron Device Letters, Nov. 2011, vol. 32, No. 11, pp. 1564-1566.

Lim, W., et al., "Low-Voltage Indium Gallium Zinc Oxide Thin Film Transistors on Paper Substrates," Applied Physics Letters, Feb. 2010, vol. 96, pp. 053510-1-053510-3.

Lin, C.-A., et al., "Significant Enhancement of Yellow-Green Light Emission of ZnO Nanorod Arrays Using Ag Island Films," Nanoscale, Jan. 24, 2011, vol. 3, pp. 1195-1199.

Martins, R. et al., "Write-Erase and Read Paper Memory Transistor," Applied Physics Letters, Nov. 17, 2008, vol. 93, 203501-1-203501-3.

Mehta, R.R., et al., "Photoconductive Gain Greater than Unity in CdSe Films with Schottky Barriers at Contacts," Journal of Applied Physics, Jan. 1973, vol. 44, No. 1, pp. 325-328.

Ni, Z.H., et al., "Uniaxial Strain on Graphene: Raman Spectroscopy Study and Band-Gap Opening," ACS Nano, Oct. 30, 2008, vol. 2, No. 11, pp. 2301-2305.

Pan, H., et al., "Tuning the Electronic and Magnetic Properties of MoS 2 Nanoribbons by Strain Engineering," The Journal of Physical Chemistry, May 10, 2012, vol. 116, pp. 11752-11757.

Pu, J., et al., "Flexible and Stretchable Thin-Film Transistors Based on Molybdenum Disulphide," Physical Chemistry Chemical Physics, 2014, vol. 16, pp. 14996-15006.

Rogers, J.A., et al., "Materials and Mechanics for Stretchable Electronics," Science, Mar. 26, 2010, vol. 327, pp. 1603-1607.

Russo, A., et al., "Pen-on-Paper Flexible Electronics," Advanced Materials, Jun. 20, 2011, vol. 23, pp. 3426-3430.

Schenk, M., et al., "Geometry of Miura-Folded Metamaterials," Proceedings of the National Academy Science US.A., Feb. 2013, vol. 110, No. 9, pp. 3276-3281.

Soci, C., et al., "ZnO Nanowire UV Photodetectors with High Internal Gain," Nano Letters, Mar. 15, 2007, vol. 7, No. 4, pp. 1003-1009.

Song, Z., et al., "Origami Lithium-Ion Batteries," Nature Communications, Jan. 28, 2014, vol. 5, pp. 3140-1-3140-6.

Tasi, D.S., et al., "n-ZnO/LaAlO3/p-Si Heterojunction for Visible-Blind UV Detection," Optics Letters, Mar. 15, 2012, vol. 37, No. 6, pp. 1112-1114.

Tobjörk, D., et al., "Paper electronics," Advanced Materials, Mar. 23, 2011, vol. 23, pp. 1935-1961.

Tsai, D.-S., et al., "Few Layer MoS2 With Broadband High Photogain and Fast Optical Switching for Use in Harsh Environments," ACS Nano, Apr. 16, 2013, vol. 7, pp. 3905-391.

Tsai, D.-S., et al., "Solar-Blind Photodetectors for Harsh Electronics," Scientific Reports, Sep. 11, 2013, vol. 3, Article No. 2628, pp. 1-5.

Tsai, D.-S., et al., "Trilayered MoS2 Metal-Semiconductor-Metal Photodetectors: Photogain and Radiation Resistance," IEEE Journal of Selected Topics in Quantum Electronics, Jan./Feb. 2014, vol. 20, No. 1, pp. 3800206-1-3800206-6.

Tsai, D.-S., et al., "Ultra-High Responsivity Broadband Detection of Si Metal-Semiconductor-Metal Schottky Photodetectors Improved by ZnO Nanorod Arrays," ACS Nano, Sep. 26, 2011, vol. 5, No. 10, pp. 7748-7753.

Tsai, S. H., el al., "Toward High Efficiency of Inverted Organic Solar Cells: Concurrent Improvement in Optical and Electrical Properties of Electron Transport Layers," Applied Physics Letters, Jun. 28, 2013, vol. 102, pp. 253111-1-253111-5.

Wang, S., et al., "Large-Area Free-Standing Ultrathin Single-Crystal Silicon as Processable Materials," Nano Letters, Jul. 22, 2013, vol. 13, pp. 4393-4398.

Wei, T.-C., et al., "See-Through Ga2O3 Solar-Blind Photodetectors for Use in Harsh Environments," IEEE Journal of Selected Topics in Quantum Electronics, Nov./Dec. 2014, vol. 20, No. 6, pp. 1-6.

Wei, W.-R., et al., "Above-11%-Efficiency Organic-Inorganic Hybrid Solar Cells with Omnidirectional Harvesting Characteristics by Employing Hierarchical Photon Trapping Structures," Nano Letters, Jul. 31, 2013, vol. 13, pp. 3658-3663.

(56) References Cited

OTHER PUBLICATIONS

Yan, C., et al., "Graphene-Based Flexible and Stretchable Thin Film Transistors," Nanoscale, May 31, 2012, vol. 4, pp. 4870-4882.
Yang, L., et al., RFID Tag and RF Structures on a Paper Substrate Using Inkjet-Printing Technology, IEEE Transactions on Microwave Theory and Techniques, Dec. 2007, vol. 55, No. 12, pp. 2894-2901.
International Search Report in related International Application No. PCT/I132016/054159, dated Oct. 14, 2016.
Written Opinion of the International Searching Authority in related International Application No. PCT/IB2016/054159, dated Oct. 14, 2016.

* cited by examiner

Strain: 0%    Strain: 700%    Strain: 1000%

DEFORMABLE PAPER ORIGAMI OPTOELECTRONIC DEVICES

CROSS-REFERENCE TO RELATED APPLICATIONS

This application is a U.S. National Stage of International Application No. PCT/IB2016/054159 and claims priority to, and the benefit of, U.S. provisional application entitled "DEFORMABLE PAPER ORIGAMI OPTOELECTRONIC DEVICES" having Ser. No. 62/191,598, filed Jul. 13, 2015, the contents of which are incorporated by reference in their entirety.

BACKGROUND

Ultraviolet (UV) photodetectors (PDs) have been widely used in commercial, scientific and military fields, such as pollution monitoring, water purification, short-range communication security, NASA aerospace applications, information storage technology, flame sensing and early missile plume detection. ZnO is an excellent semiconductor material for UV detection due to its wide bandgap, excellent thermal and chemical stability as well as electrical, mechanical, and optical properties. To improve field of view and illumination uniformity as well as aberrations compared to planar UV PDs, the stretchable approaches were used in carrying out UV PD arrays on hemispherical surfaces of cameras with the mammalian eye geometrical layouts, thereby offering important advantages for applications in the astronomical observation, missile defense and satellite technology, as examples.

Stretchable electronics hold a promising future for next-generation applications beyond the extents of traditional semiconductor wafers and circuit board technologies, benefiting from their unique capacity to integrate with soft materials and curvilinear surfaces, and thus allow us to use in biomedical sensors, wearable devices and robotic skins. Over the past few years, a wide variety of deformable devices were presented sequentially by using various soft materials (such as ultrathin silicon wafers (thickness range: from 2 to 10 µm), Polydimethylsiloxane (PDMS) substrates and 2D materials) and particular structures (such as island bridges, open mesh geometrics and wavy shapes), respectively. However, most of above-mentioned strategies of making stretchable electronics are complex and costly.

Paper, a soft material with truly low cost (one tenth the price of plastic film, one percent as much as silicon), has a lot going for it—lightweight, flexible, biodegradable and recyclable. Via proper additives and manufacturing processes, paper can emerge a seemingly endless range of properties (such as hydrophilic or hydrophobic, porous or watertight, opaque or nearly transparent, delicate or strong, coarse or about as smooth as glass). Up to date, a lot of reports have discussed paper-based electronics, such as TFTs, solar cells, LEDs, RFID tags, electronic memory devices and light sensors, proposing low-cost fabrication processes (e.g., spin coating, inkjet printing and sputtering). However, as compared to soft materials (such as ultrathin silicon wafers (the strain of ~1%), PDMS substrates (the strain of ~100%) and 2D materials (the strain of <10%)) and electronics with particular structures (such as island bridge (the strain of 20 to ~150%), open mesh geometrics (the strain of 18%) and wavy shape (the strain of ~5%)20), the stretchability of electronics based paper is still low (less than 1%), thus hindering practical applications.

There remains a need for improved optoelectronic devices such as photodetectors that are durable and inexpensive to make.

It is therefore an object of this disclosure to provide improved optoelectronic devices that can be made inexpensively and can be durable under a variety of conditions.

It is also an object of this disclosure to provide inexpensive methods of making improved optoelectronic devices.

It is an additional object of this disclosure to provide methods of using the improved optoelectronic devices, for example in detecting ultraviolet radiation.

SUMMARY

We provide herein electro electronic devices to address the aforementioned needs. In one or more aspects the devices can be photo detector (PD) arrays based on paper. The devices can be flexible and ultra-stretchable deices. They can be used in wearable electronics and easily combined with other flexible devices.

In one or more aspects the devices can be photodetector (PD) arrays based on paper using screen printed methods and Miura-origami (Miura-ori) technology that exhibit ultra-high stretchable (strain: up to 1000%), bendable (bending angle: >30°) and twistable (twist angle: up to 360°) properties. Compared to under high strain (>500%), the AOI-dependent variation of PDCR is small (from −20% to −40%) under low strain (from 0% to 500%) even at the largest angle of incidence (85°), showing the ultra-high omnidirectional property. Ultra-stable performance of paper-based PD arrays with Miura-ori structures was measured even after 400-cycle stretching, bending and twisting processes, respectively, showing an outstanding capability for various practical conditions such as different size of light sources, various curve and uneven surfaces. Via the fusion of paper substrates, origami methods and PD unite cells. The paper-based PDs can be low-cost arrays for next-generation deformable optoelectronic applications. The PD arrays can be zinc oxide (ZnO) ultra-violet (UV) arrays.

In an embodiment, a deformable optoelectronic device is provided. The deformable optoelectronic device can comprise (a) a paper substrate comprising a plurality of fold segments arranged in a deformable pattern; (b) an electrode layer attached to a surface of the substrate; (c) a semiconductor nanowire layer contacting at least a portion of the electrode. In one or more aspects the device can undergo a strain of up to 500% device can undergo a bending angle of up to 25°. The device can undergo a twist angle of up to 270°. The electrode can comprise a carbon electrode. The semiconductor nanowire layer can comprise a semiconductor selected from the group consisting of zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), zirconium oxide ($ZrO_2$), gallium nitride (GaN), aluminum gallium nitride ($Al_xGa_{1-x}N$), silicon carbide (SiC), and zinc sulfide (ZnS).

In any one or more aspects, the semiconductor nanowire layer can comprise a wide-bandgap semiconductor. The semiconductor nanowire layer can be a monolayer. The semiconductor nanowire layer can have a thickness of about 20 μm to 200 μm and any range in between. The device can be stable, omnidirectional, or both. The paper substrate can be selected from the group consisting of a natural paper substrate, a synthetic paper substrate, and combinations thereof. Each of the fold segments can be a parallelogram. The fold segments can form a tessellation of the substrate surface. The electrode layer can comprise a plurality of interconnects connecting each of the fold segments to one or more adjacent fold segments. The optoelectronic device can be a photodetector, a photodiode, or a photovoltaic cell. The deformable pattern can be a Miura origami pattern.

In an embodiment a method of making a deformable optoelectronic device is provided. The method can comprise: (a) applying an electrode material to a surface of a paper substrate to form an electrode layer attached to the surface of the paper substrate; (b) applying a semiconductor nanowire to the surface of the paper and at least a portion of the electrode layer to form a semiconductor nanowire layer contacting at least the portion of the electrode layer; and (c) creating a plurality of fold segments in the paper substrate to form a deformable pattern. The deformable optoelectronic device made can be the aforementioned deformable optoelectronics device in any one or more of the aforementioned aspects.

In any one or more aspects, the step of applying the electrode material can comprise screen printing at least one electrode material on the surface of the paper substrate. The step of applying a semiconductor nanowire can comprise making an ink comprising the semiconductor nanowire and painting the ink onto the surface of the paper substrate to form the semiconductor nanowire layer. The creating a plurality of fold segments can comprise creating a plurality of fold lines including both mountain folds and valley folds to form the deformable pattern.

In an embodiment, a method of detecting a photon of light is provided. The method can comprise: (a) applying a bias voltage to a deformable optoelectronic device; (b) impacting a semiconductor nanowire layer in the device with the photon; and (c) detecting a current in an electrode layer of the device in response to the photon impacting the semiconductor nanowire layer. In one or more aspects, the light can be ultraviolet light. The current can be from 1 nA to 250 nA. The method can apply a bias voltage to the aforementioned deformable optoelectronics device in any one or more of the aforementioned aspects.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

FIGS. 31A-31C are photographs of paper-based Zinc Oxide (ZnO) ultraviolet (UV) photodetector (PD) arrays with Miura-ori structures outside a transparent container (FIG. 31A), inside the neck part of a transparent container (FIG. 31B), and inside the body part of a transparent container (FIG. 31C).

DETAILED DESCRIPTION

Figure 1:
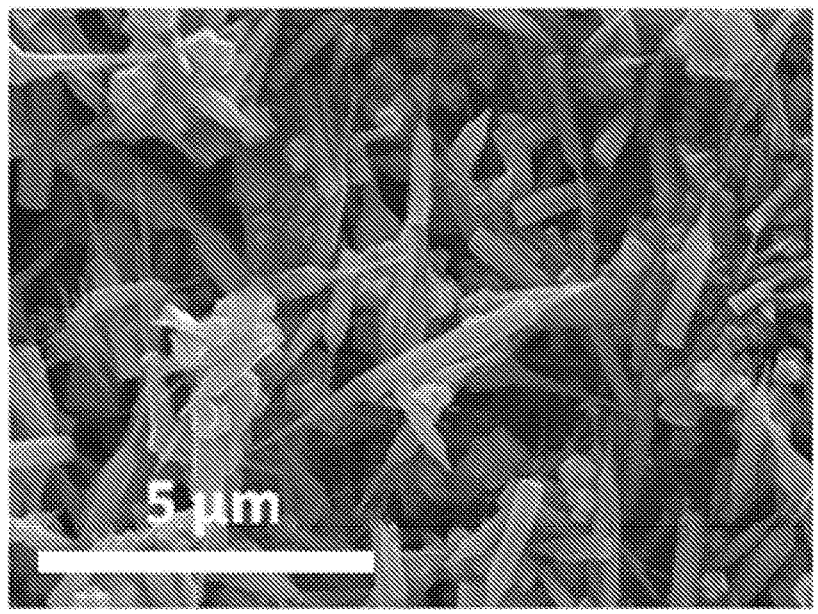
FIG. 1 is a scanning electron microscope (SEM) image of Zinc Oxide (ZnO) nanowires (NWs) on a paper substrate.

Deformable optoelectronic devices are provided herein. The devices can be stable and omnidirectional and can be made inexpensively. The optoelectronic devices can be photodetectors, photodiodes, or photovoltaic cells. The optoelectronic devices can include a paper substrate having a plurality of fold segments arranged in a deformable pattern. The optoelectronic device can have an electrode layer attached to a surface of the substrate and a semiconductor nanowire layer contacting at least a portion of the electrode. The devices can undergo strains up to 500% or more, bending angles up to 25° or more, and/or twist angles up to 270° or more.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure and to be encompassed by the claims herein.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'" includes "about 'x' to about 'y'".

Definitions

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The term "monodisperse", as used herein, refers to a population of particles (e.g., oligomers, dendrimers, or polymers) wherein the particles have substantially identical size and shape. A "monodisperse" population of particles can mean that at least about 60%, 70%, 80%, 90%, 95%, 99%, 99.5%, or more of the particles fall within a specified particle size range that is within plus or minus about 25%, 20%, 15%, 10%, 5%, 3%, 2%, 1%, or less of the root-mean-square (rms) size of the particles in the population.

The term "planar", as used herein, means a surface or sheet where the position normal to the surface does not deviate from the average position normal to the surface by more than about 10 µm, 5 µm, 2 µm, 1 µm, or less.

When referring to radiation, as used herein, the term "visible" refers to radiation having a wavelength of about 300-800 nm, about 325-750 nm, about 350-740 nm, or about 370-720 nm; the term "ultraviolet" or "UV" refers to radiation having a wavelength of about 150-450 nm, about 170-400 nm, about 190-350 nm, or about 200-300 nm; and the term "infrared" or "IR" refers to radiation having a wavelength of about 0.7-1,000 µm, about 0.7-50 µm, about 0.74-14 µm, about 0.75-8 µm, or about 0.75-5 µm. The radiation can be described herein as "near ultraviolet" or "near UV" when the wavelength of the radiation is about 290-430 nm, about 300-400 nm, about 310-395 nm, or about 320-380 nm. The radiation can be described herein as "deep ultraviolet" or "deep UV" when the wavelength of the radiation is about 150-320 nm, about 185-310 nm, or about 200-300 nm. The radiation can be described herein as "violet" if it has a wavelength of about 300-450 nm, about 325-440 nm, about 350-430 nm, or about 360-420 nm; as "indigo" if it has a wavelength of about 400-480 nm, about 420-460 nm, about 430-450 nm, or about 440 nm; as "blue" if it has a wavelength of about 430-520 nm, about 440-510 nm, about 450-500 nm, or about 460-490 nm; as "cyan" if it has a wavelength of about 480-540 nm, about 490-530 nm, about 500-520 nm, or about 501 nm; as "green" if it has a wavelength of about 500-600 nm, about 510-580 nm, about 520-565 nm, or about 540-550 nm; as "yellow" if it has a wavelength of about 540-610 nm, about 550-600 nm, about 564-590 nm, or about 589 nm; as "orange" if it has a wavelength of about 570-650 nm, about 580-640 nm, about 590-625 nm, or about 593 nm; and as "red" if it has a wavelength of about 600-800 nm, about 610-780 nm, about 625-740 nm, or about 650-720 nm. The radiation can be described herein as "near infrared" or "NIR" if it has a wavelength of about 700-3,000 nm, about 740-1,400 nm, or about 750-1,000 nm; as "short-wave infrared" or "SWIR" if it has a wavelength of about 850-2,000 nm, about 900-1,700 nm, or about 1,000-1,400 nm; as "medium-wave infrared" or "MWIR" if it has a wavelength of about 2-8 µm, about 3-5 µm, or about 3.5-4.5 µm; and as "long-wave infrared" or "LWIR" if it has a wavelength of about 7-14 µm, about 8-12 µm, or about 9-10 µm.

Deformable Optoelectronic Devices

Deformable optoelectronic devices are provided. The deformable optoelectronic device can have a paper substrate with a plurality of fold segments arranged in a deformable pattern such as a Miura origami pattern. The deformable optoelectronic device can contain an electrode attached to a surface of the substrate and a semiconductor nanowire contacting at least a portion of the electrode. The deformable optoelectronic device can be a photodetector, a photodiode, a photovoltaic cell, or other type of optoelectronic device.

The optoelectronic device is deformable. The term "deformable", as used herein, refers to a material or device that can undergo a reversible change of at least one physical dimension. A deformable material or device can under a reversible change of one, two, or all three physical dimensions. In some embodiments a deformable material or device is relatively planar and can undergo a reversible physical deformation in one or both of the larger dimensions that dramatically decreases the size of the larger dimension(s). The optoelectronic device can be stretchable, bendable, and/or twistable. The term "stretchable", as used herein, refers to the ability of a material or device to be reversibly extended or compacted along a single dimension. The optoelectronic device can undergo a strain of up to 500%, 750%, 1000%, 2000%, 5000%, 10000%, or more. The term "bendable", as used herein, refers to the ability of a material or device to undergo a reversible out of plane deformation. The optoelectronic device can undergo a bending angle of up to about 15°, 20°, 25°, 30°, 35°, 40°, 70°, or more. The term "twistable", as used herein, refers to the ability of a material or device to undergo a reversible twist along at least one axis or dimension. The optoelectronic device can undergo a twist angle of up to about 180°, 270°, 360°, 450°, or more.

The optoelectronic device can be stable and/or omnidirectional, allowing the device to function in a variety of environments and over a variety of uneven surfaces. The optoelectronic device can be capable of stable performance on surfaces having a radius of curvature of about 10, 9, 8, 7, 6, 5, 4, 3, 2, 1, 0.5, 0.2 inches or less. The performance of the optoelectronic device can be stable. The performance of an optoelectronic device can be said to be stable when the performance, e.g. the photocurrent, the photoluminescence intensity, or the photo-to-dark current ratio, changes by about 20%, 15%, 12%, 10%, 9%, 8%, 7%, 6%, 5%, 4%, 3%, 2%, or less over about 100, 150, 200, 250, 300, 350, 400, 500, or more cycles of stretching, twisting, or bending. The performance of the optoelectronic device with 0% strain can be omnidirectional. The performance of an optoelectronic device can be said to be omnidirectional when the performance, e.g. the photocurrent, the photoluminescence intensity, or the photo-to-dark current ratio, changes by about 80%, 60%, 50%, 406%, 30%, 20%, or less when the angle of incidence or viewing angle is changed from normal to about 80°, 60°, 50°, 40° 30°, 25°, or less.

Paper Substrate

The deformable optoelectronic device can have a paper substrate. The properties of the paper substrate can be tailored for the given application. The paper substrate can be hydrophilic or hydrophobic, porous or watertight, opaque or nearly transparent, delicate or strong, coarse or smooth. The paper substrate can have a thickness of about 1 mm to 50 mm, about 1 mm to 40 mm, about 2 mm to 40 mm, about 2 mm to 30 mm, about 3 mm to 30 mm, about 3 mm to 25 mm, about 5 mm to 25 mm, about 5 mm to 20 mm, about 5 mm to 15 mm, about 5 mm to 12 mm, or about 7 mm to 12 mm, or about 1 mm to 10 mm.

The paper substrate can be deformable. The paper substrate can undergo a strain of up to 500%, 750%, 1000%, 2000%, 5000%, 10000%, or more. The paper substrate can undergo a bending angle of up to about 15%, 20%, 25%, 30%, 35%, 40%, 70%, or more. The paper substrate can undergo a twist angle of up to about 180°, 270°, 360°, 450°, or more. The paper substrate can be a natural paper substrate. The term "natural paper", as used herein, refers to a web of pulp fibers that are formed, for example, from an aqueous suspension on a wire or screen, and are held together at least in part by hydrogen bonding. Papers can be manufactured by hand or by machine. Paper can be formed from a wide range of matted or felted webs of vegetable fiber, such as "tree paper" manufactured from wood pulp derived from trees, as well as "plant papers" or "vegetable papers" which include a wide variety of plant fibers (also known as "secondary fibers"), such as straw, flax, and rice fibers. Paper can be formed from substantially all virgin pulp fibers, substantially all recycled pulp fibers, or both virgin and recycled pulp fibers. Paper may include adhesives, fillers, dyes, or other additives.

The paper substrate can be a synthetic paper substrate. The term "synthetic paper", as used herein, refers to plastic film and sheet products having a feel and printability similar to cellulose paper, e.g. paper-like laminar structures made in the form of thin sheets or films of synthetic resinous materials employed for various uses, such as writing and printing, as distinguished from natural cellulose paper. Synthetic papers can be made from polymers such as polyolefins, polyamides, polyesters, polypropylenes, polyacrylonitriles, polyvinylchloride, co-polymers thereof, and combinations thereof.

Deformable Pattern

The deformable device and/or the paper substrate can include a deformable pattern. For example, the deformable device and/or the paper substrate can include a plurality of fold segments arranged in a deformable pattern. A variety of deformable patterns are known to the skilled artisan. The deformable pattern can be used to provide the desired level of deformability to the device, e.g. the desired level of stretch-ability, fold-ability, and/or twist-ability, while maintaining the performance characteristics and structural stability of the components on the device or substrate. In some embodiments the deformable pattern is a Miura origami pattern. The Miura origami pattern or Miura fold, is a type of rigid origami fold pattern (i.e., treating the folds as hinges joining two flat and rigid surfaces).

The deformable device and/or the paper substrate can include a plurality of fold segments. The fold segments can be planar. The fold segments can be a variety of shapes, but in some embodiments the fold segments are parallelograms. The fold segments can form a tessellation of the substrate surface. The term "tessellation", as used herein, refers to a deformable pattern that covers a surface by repeating one or more shapes (segments) with no overlaps and no gaps. A tessellation can be formed by repeating a single shape or a few shapes. The shapes or segments in a tessellation differ only in their rotation and/or translation on the surface. In some embodiments, the deformable device and/or the substrate can be folded or unfolded by a single motion while the fold segments remain planar.

The deformable pattern can include a plurality of fold lines. The fold lines can form the deformable pattern or structure. The fold line can be a mountain fold or a valley fold. The terms "mountain fold" and "valley fold", as used herein, refer to the directionality of a fold with respect to a surface of the substrate or device. A "mountain fold" describes a fold line where the crease along that fold line produces a convex surface and the crease along that fold line is coincident with the points that cap the ridge or arch so formed. A "valley fold" describes a fold line where the crease along that fold line produces a concave surface and the crease along that fold line is coincident with the lowest point of the trough or valley so formed. For a planar material such as a paper, a valley fold with respect to one surface will correspond to a mountain fold with respect to the opposite surface and vice versa.

Figure 32:
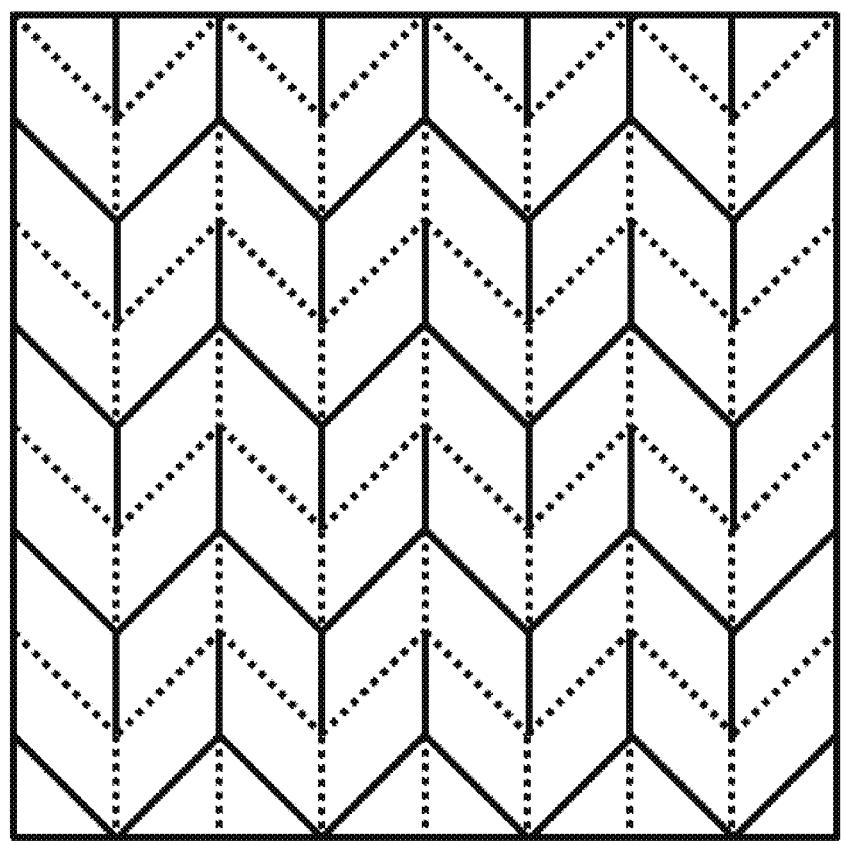
FIG. 32 is a diagram of an another type Miura fold depicting mountain folds as solid lines and valley folds as dashed lines and demonstrating the tessellation of the surface by the parallelograms.

In some embodiments the deformable pattern is a Miura origami pattern where a plurality of fold lines divides the device and/or the paper substrate into a plurality of parallelogram fold segments. In the Miura origami pattern the fold lines along one direction form as series of parallel straight lines while the fold lines along the Slanted direction form zigzag patterns. Each of the zigzag patterns is made solely of all mountain folds or solely of all valley folds, while the fold lines in each straight line segment alternates between a mountain fold and valley fold. An exemplary Miura fold pattern is depicted in FIG. 32 where the straight-line folds run horizontally and the zigzag folds run vertically along the plane of the surface.

Electrode Layer

The deformable optoelectronic device can have an electrode layer attached and/or adhered to a surface of the substrate. The electrode layer can be a variety of electrode materials. The electrode layer can be a printable electrode layer. The thickness of the electrode layer on the substrate can depend upon the specific electrode material, the particular substrate material, as well as the application. The thickness of the electrode layer on the substrate can be about 10 µm to 10 mm, 10 µm to 5 mm, 10 µm to 1 mm, 20 µm to 1 mm, 20 µm to 800 µm, 20 µm to 500 µm, 20 µm to 200 µm, 20 µm to 100 µm, or 20 µm to 50 µm, or 10 µm to 1 mm.

The electrode layer can contain a carbon electrode. The carbon electrode can include carbon nanoparticles such as carbon nanotubes, carbon nanospheres, or the like. The carbon electrode can include activated carbon, carbon blacks, or graphene. The carbon electrode can include a printable carbon electrode.

The electrode layer can contain conductive metal particles, e.g. the electrode layer can contain metal nanoparticles. Suitable metals can include noble metals, such as silver, gold, platinum or palladium; copper, zinc, manganese, nickel, molybdenum, vanadium, aluminium, lead, beryllium, niobium, magnesium, iron, tungsten, cobalt, cadmium, titanium or mixtures thereof such as copper tungsten or silver tungsten, Other examples can include metal oxide electrode materials such as $LiMO_2$ (with M=Ni, Co, V).

The electrode layer can include conductive polymer materials. Conductive polymers which can be used as electrode materials include, but are not limited to polyacetylenes, polypyrroles, polythiophenes, polyanilines, polyfluorenes, poly-3-alkylthiophenes, polynaphthalenes, poly(p-phenylene-sulfide) and poly(para-phenylene vinylenes), derivatives thereof or doped forms thereof.

The electrode layer can include a series of interconnects or wires having a width of about 100 μm to 5 mm, 500 μm to 5 mm, 500 μm to 4 mm, 500 μm to 3 mm, 750 μm to 3 mm, 1 mm to 3 mm, or about 1 mm to 2 mm. The interconnects can be in contact with one or more semiconductor nanowire layers as well as in contact with one or more contact pads or other optoelectronic components on the paper substrate. The contact can be electrical contact. In some embodiments the inter-connects can cross over a fold line. For example, in some embodiments a plurality of interconnects cross over the fold lines in the deformable patter connecting each of the fold segments to one or more adjacent segments on the substrate. In some embodiments the inter-connect is reinforced at the point where it crosses the fold line. The reinforcement can include coating the inter-connect at the point it crosses the fold line with a conductive paste such as a silver paste.

Semiconductor Nanowire Layer

The deformable optoelectronic device can include a semiconductor nanowire layer. The term "nanowire", as used herein, refers to a nanoparticle having one dimension that is extended relative to other two dimensions and where the other two dimensions (the cross sectional dimensional perpendicular to the long dimension) are about 500 nm, 400 nm, 300 nm, 200 nm, 100 nm, 50 nm, 30 nm, or less. The nanowire can have an aspect ratio (length/width) that is about 10, 20, 30, 40, 50, 75, 100, 125, 150, or greater. The semiconductor nanowires can be monodisperse. The semiconductor nanowire layer can be in contact with the electrode layer, e.g. can be in contact with one or more interconnects in an electrode layer. The contact can be electrical contact.

The semiconductor nanowire layer can be a monolayer or can include 2, 3, 4, or more layers of the semiconductor nanowires. The semiconductor nanowire layer can have a thickness of about 10 μm to 10 mm, 10 μm to 5 mm, 10 μm to 1 mm, 20 μm to 1 mm, 20 μm to 800 μm, 20 μm to 500 μm, 20 μm to 200 μm, 20 μm to 100 μm, or 20 μm to 50 μm.

The semiconductor nanowire layer can include a plurality of semiconductor nanowires. The semiconductor can be a large bandgap or a wide bandgap semiconductor, e.g. a bandgap of about 2.2 eV, 2.5 eV, 3.0 eV, 3.2 eV, 3.3 eV, 3.4 eV, 3.5 eV, or more. The semiconductor nanowires can be intertwined in the semiconductor nanowire layer. The semiconductor nanowires can include a semiconductor such as zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), zirconium oxide ($ZrO_2$), gallium nitride (GaN), aluminum gallium nitride ($Al_xGa_{1-x}N$), silicon carbide (SiC), and zinc sulfide (ZnS).

Methods of Making Deformable Optoelectronic Devices

Methods of making deformable optoelectronic devices are provided. The methods can include applying an electrode material to a surface of a paper substrate to form an electrode layer attached to the surface of the paper substrate. The methods can include applying a semiconductor nanowire to the surface of the paper and at least a portion of the electrode layer to form a semiconductor nanowire layer contacting at least a portion of the electrode layer. The methods can include creating a plurality of fold segments in the paper substrate to form a deformable pattern.

The methods can include applying an electrode material to a surface of a paper substrate to form an electrode layer attached to the surface of the paper substrate. The methods can include applying any of the electrode materials described herein. The methods can include screen printing at least one of the electrode materials on the surface of the paper substrate. Methods of screen printing electrodes are generally known. The electrode materials can be formulated as solutions, inks, or pastes prior to printing. The electrode materials can be formulated in a suitable solvent. The solvent can be a suitable organic solvent. The method can include drying the electrode layer, for example baking at an elevated temperature to remove the solvent.

The methods can include applying a semiconductor nanowire to the surface of the paper and at least a portion of the electrode layer to form a semiconductor nanowire layer contacting at least a portion of the electrode layer. The methods can include making an ink containing the semiconductor nanowire and painting the ink onto the surface of the paper substrate to form the semiconductor nanowire layer. The inks can be formulated in a suitable solvent such as ethanol and a surfactant such as octyl phenol ethoxylate. The inks can be dried at elevated temperatures to remove the solvent.

The methods can include creating a plurality of fold segments in the paper substrate to form a deformable pattern. The fold segments can be created by creating a plurality of fold lines, including mountain folds and valley folds, such as by folding, bending, or creasing the paper substrate. In some embodiments the fold segments are created in the substrate prior to applying the electrode material and/or prior to applying the semiconductor nanowire layer. In some embodiments the fold segments are created after the semiconductor nanowire layer has been applied to the surface of the substrate. The deformable pattern can include any deformable pattern described herein.

Methods of Using Deformable Optoelectronic Devices

Method of using the deformable optoelectronic devices are provided. In some embodiments the device is a photodetector. The methods can include detecting a photon of light. The light can have any intensity. In some embodiments the light has an intensity of about 0.1 $mW/cm^2$ to 10 $mW/cm^2$, about 0.5 $mW/cm^2$ to 10 $mW/cm^2$, about 0.5 $mW/cm^2$ to 5 $mW/cm^2$, or about 1 $mW/cm^2$ to 5 $mW/cm^2$. The light can be any wavelength of light described herein, e.g any wavelength capable of generating an excitation in the particular semiconductor nanowires used. In some embodiments the light is ultraviolet (UV) light. The methods can include applying a bias voltage to the deformable optoelectronic device, e.g. applying a bias voltage to the electrode layer. The bias voltage can, in some embodiments, be about 0.05 V to 10 V, about 0.05 V to 6 V, about 0.1 V to 50 V, about 0.1 V to 4 V, or about 1 V to 4 V. The methods can include impacting a semiconductor nanowire layer in the device with the photon. The methods can then include detecting a current in an electrode layer in the device in response to the photon impacting the semiconductor nanowire layer. The current can be any current large enough to be detectable. However, in some embodiments, the current is about 1 nA to 1000 nA, about 1 nA to 500 nA, about 1 nA to 250 nA, or about 50 nA to 250 nA

EXAMPLES

Now having described various embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Summary Zinc Oxide (ZnO) ultraviolet (UV) photodetector (PD) arrays based on paper using screen printed methods and Miura-origami (Miura-ori) technology exhibit ultra-high stretchable (e.g. strain: up to 1000%), bendable (e.g. bending angle: >30°) and twistable (e.g. twist angle: up to 360°) properties. Compared to under high strain (>500%), the angle of incident (AOI)-dependent variation of photo-to-dark current ratio (PDCR) is small (from −20% to −40%) under low strain (from 0% to 500%) even at the largest angle of incidence (85°), showing the ultra-high omnidirectional property. Moreover, ultra-stable performance of paper-based ZnO UV PD arrays with Miura-ori structures was measured even after 400-cycle stretching, bending and twisting processes, respectively, showing the outstanding capability for various practical conditions such as different size of light sources, various curve and uneven surfaces. Via the fusion of paper substrates, origami methods and ZnO UV PD unite cells, the strategy described here opens avenues to develop paper-based PDs with low-cost for the next-generation deformable optoelectronic applications.

Fabrication of Paper-Based ZnO UV PD Arrays with Miura-Ori Structures

To prepare the devices, a carbon paste was firstly screen printed onto a paper as an electrode and then baked at 70° C. in a vacuum oven for 20 minutes to remove organic solvent residues. ZnO NWs were prepared by heating the mixed ZnO and carbon powders (ZnO:carbon=6.6 g: 3.3 g) in the furnace at 930° C. with 200-sccm Ar gas flow as the carrier gas via vapor-liquid-solid methods 34. Then, ZnO inks (a mix of ZnO NWs, ethanol solution and a little surfactant (Triton™ X-100, Sigma-Aldrich Co.)) were fabricated by sol-gel methods 45. The ZnO inks were painted across the carbon electrodes by brush to form ZnO NWs layers, and then the ZnO NWs layers with carbon electrodes were placed on a hotplate for 10 minutes to remove the ethanol. The paper-based device was finally folded into Miura-ori structures, and the carbon electrodes on the fold lines were reinforced by silver paste.

A Keithley 2400-SCS semiconductor characterization system was used to measure current-voltage (I-V) characteristics of paper-based ZnO UV PD arrays with Miura-ori structures under various measuring conditions (such as, different light intensity, angle of incident light, different size of light sources, various curve and uneven surfaces).

Results and Discussion

Figure 2:
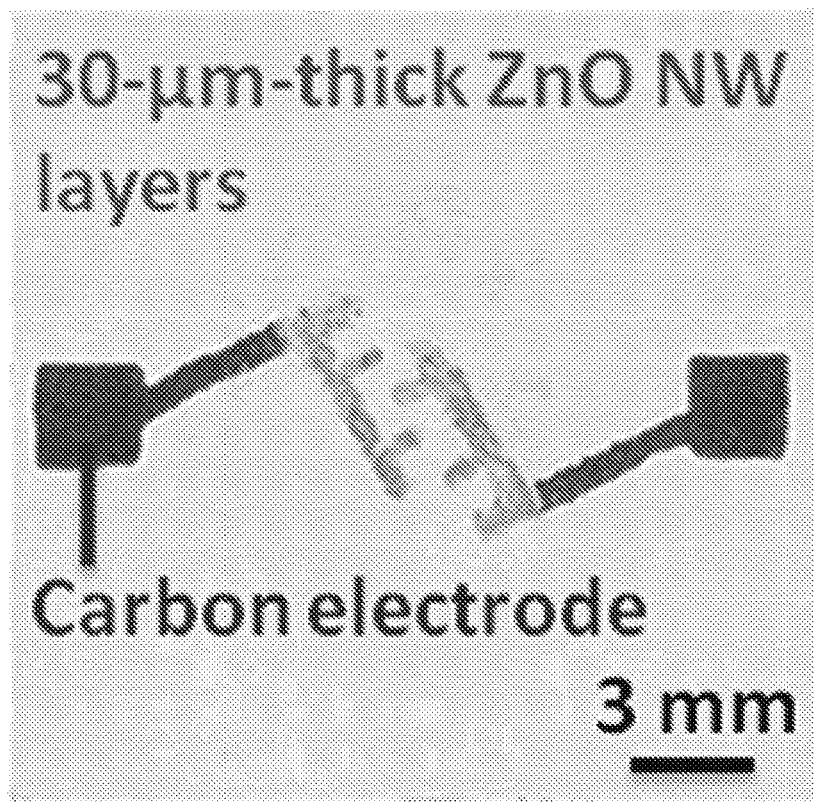
FIG. 2 is a photograph of a unit cell of a paper-based Zinc Oxide (ZnO) ultraviolet (UV) photodetectors (PDs) with one-layer ZnO nanowires (NWs).
Figure 3:
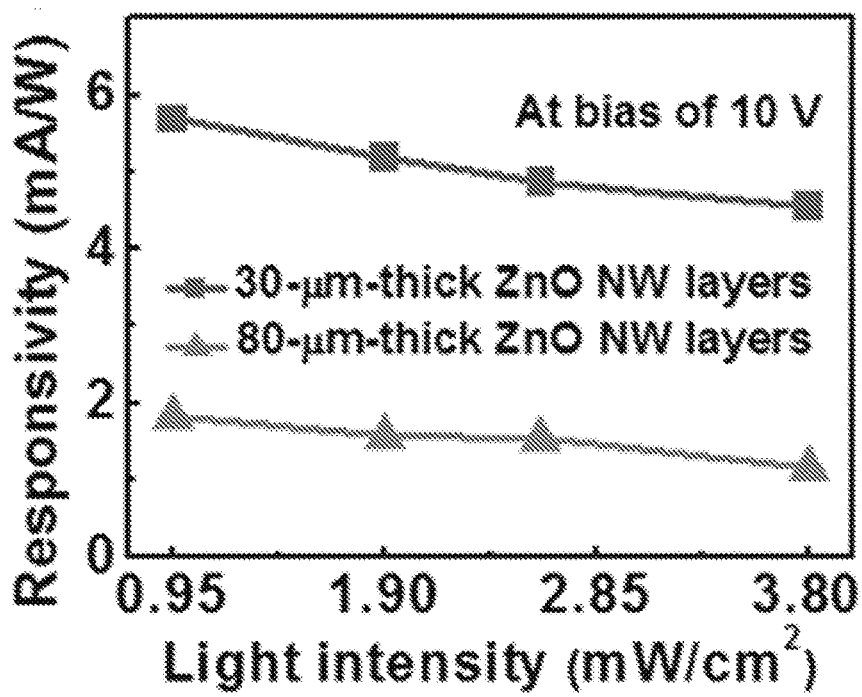
FIG. 3 is a graph of the responsivity (mA/W) of a paper-based Zinc Oxide (ZnO) ultraviolet (UV) photodetector (PD) unit cell with one-layer and three-layer ZnO nanowires (NWs) as a function of light intensity measured (mW/cm$^2$) under a bias of 10 V.
Figure 23:
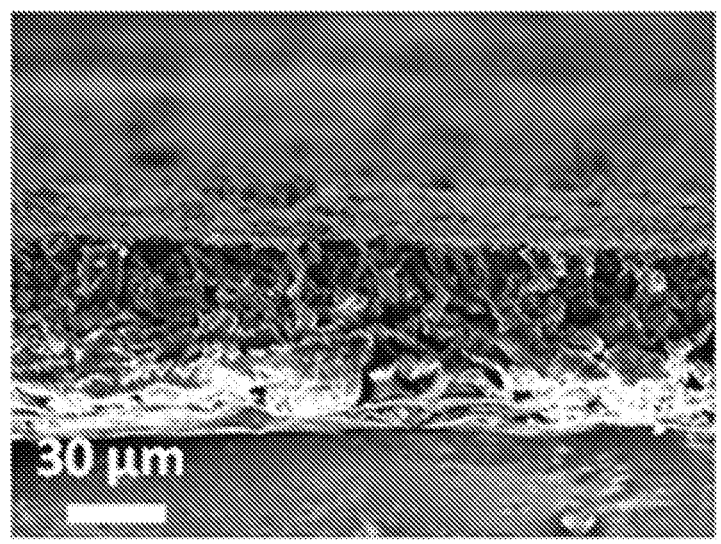
FIG. 23 is a cross-sectional scanning electron microscope (SEM) image of one-layer Zinc Oxide (ZnO) nanowires (NWs) on a paper substrate.
Figure 24:
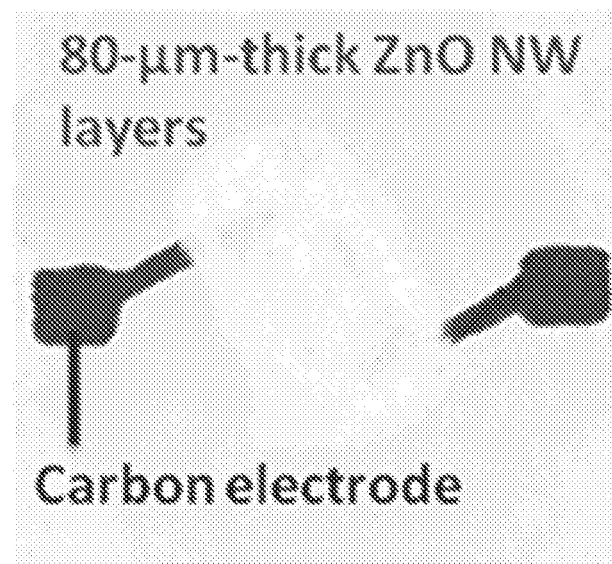
FIG. 24 is a photograph a unit cell of paper-based ZnO UV PDs with three-layer ZnO NWs from the front side (upper photograph) and the back side (lower photograph).

FIG. 1 is the scanning electron microscopy (SEM) image of the ZnO NW morphology, showing that the ZnO NWs were successfully printed on the paper substrates and cross linked each other randomly. FIG. 2 is a photograph of a unit cell of paper-based ZnO UV PDs with one-layer ZnO NWs. As shown in FIG. 23 and FIG. 24, the thickness of the one-layer ZnO NWs is only approximately 30 μm. In order to estimate the influence of ZnO NW thickness in paper-based UV PDs, the responsivity ($R_I=I/(P_{in}\times A)$, where $R_I$ is the responsivity, I is the photocurrent, $P_{in}$ is the incident UV power density, and A is the active area of PDs) of paper-based UV PDs with one-layer (thickness: ~30 μm) and three-layer (thickness: ~80 μm) ZnO NWs was measured, respectively. FIG. 3 shows the responsivity of the paper-based ZnO UV PDs with one-layer and three-layer ZnO NWs as function of incident light intensity at 10 V bias, respectively. The responsivity of paper-based UV PD with one-layer ZnO NWs is higher than with three-layer ZnO NWs, indicating that responsivity is limited by relatively thick ZnO NW films due to a short penetration depth of UV light. Furthermore, the thicker ZnO NW films would also increase the probability of electron-hole recombination, resulting in the lower responsivity of paper-based UV PDs with three-layer ZnO NWs. One can see that the responsivity of paper-based ZnO UV PDs gradually decreases with increase of incident light intensity, implying that the recombination mechanism switches to bimolecular recombination under high intensity illumination.

Figure 4:
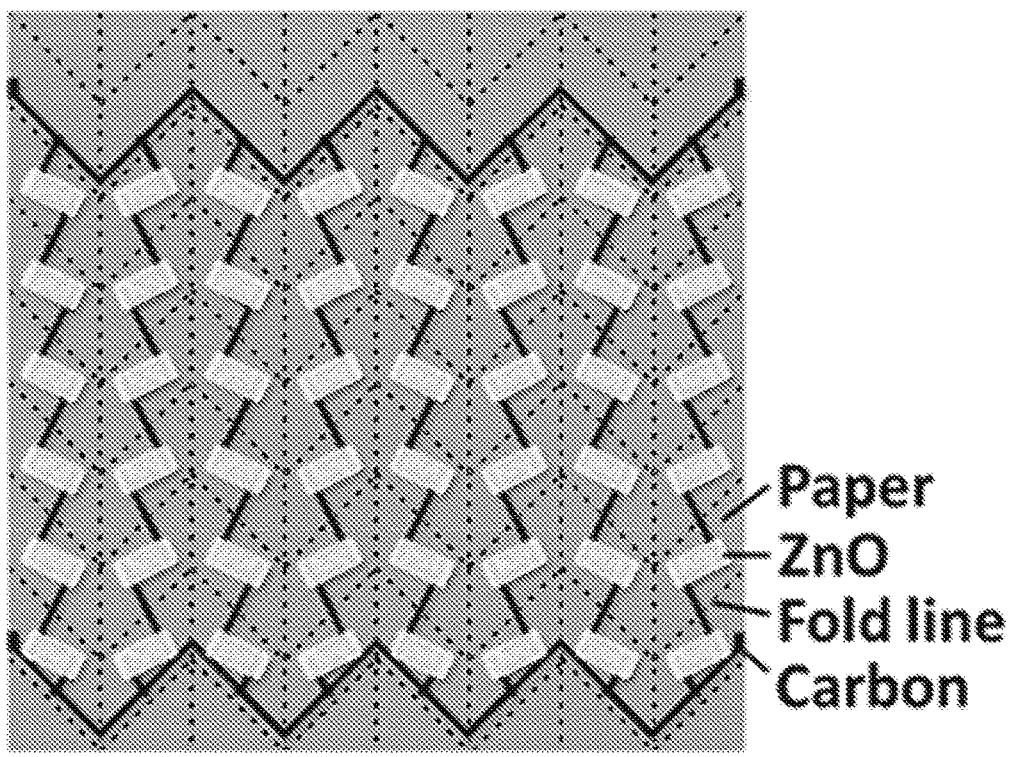
FIG. 4 is a schematic diagram of paper-based Zinc Oxide (ZnO) ultraviolet (UV) photodetector (PD) arrays with Miura-ori structures in the completely unfolded state.
Figure 5:
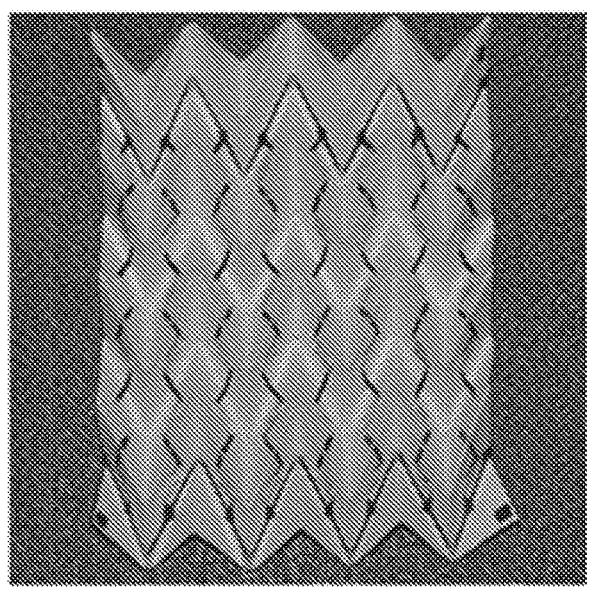
FIG. 5 is a photograph of paper-based Zinc Oxide (ZnO) ultraviolet (UV) photodetector (PD) arrays with Miura-ori structures.
Figure 6:
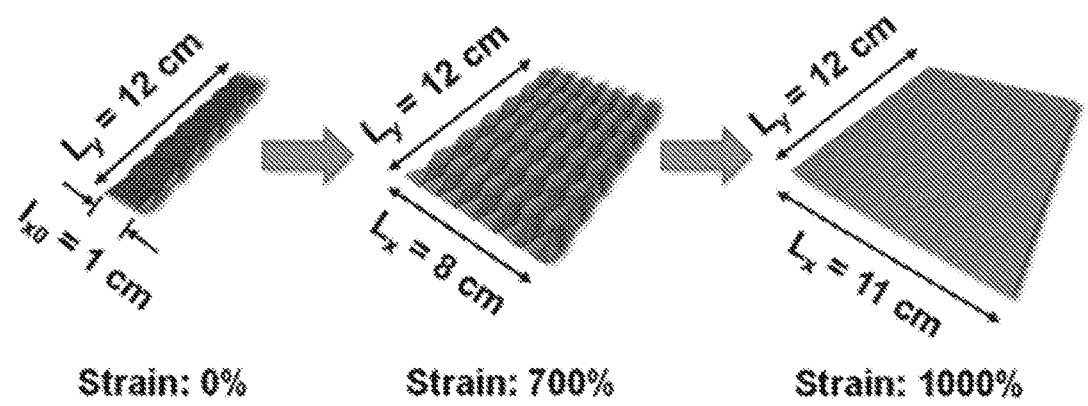
FIG. 6 is a schematic diagram of paper-based Zinc Oxide (ZnO) ultraviolet (UV) photodetector (PD) arrays with Miura-ori structures under stain of 0%, 700% and 1000%, respectively.
Figure 7:
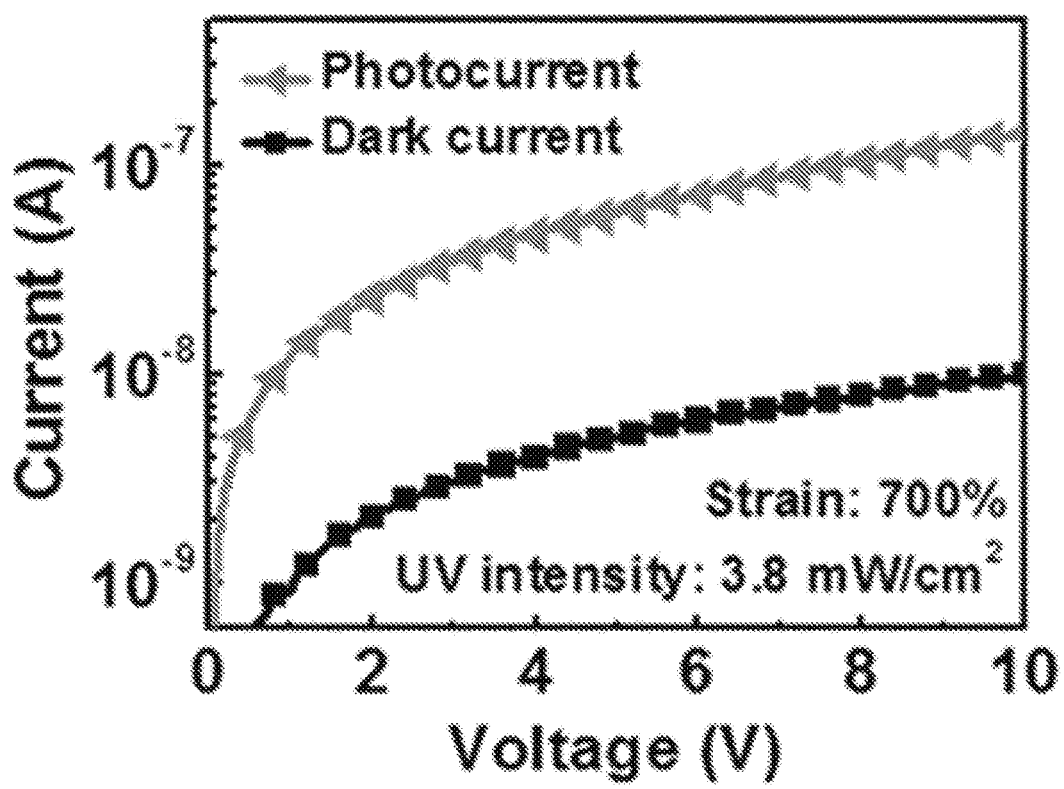
FIG. 7 is a graph of current-voltage (I-V) curves of paper-based Zinc Oxide (ZnO) ultraviolet (UV) photodetector (PD) arrays with Miura-ori structures measured in dark and under UV illumination with the light density of 3.8 mW/cm2 at room temperature.
Figure 8:
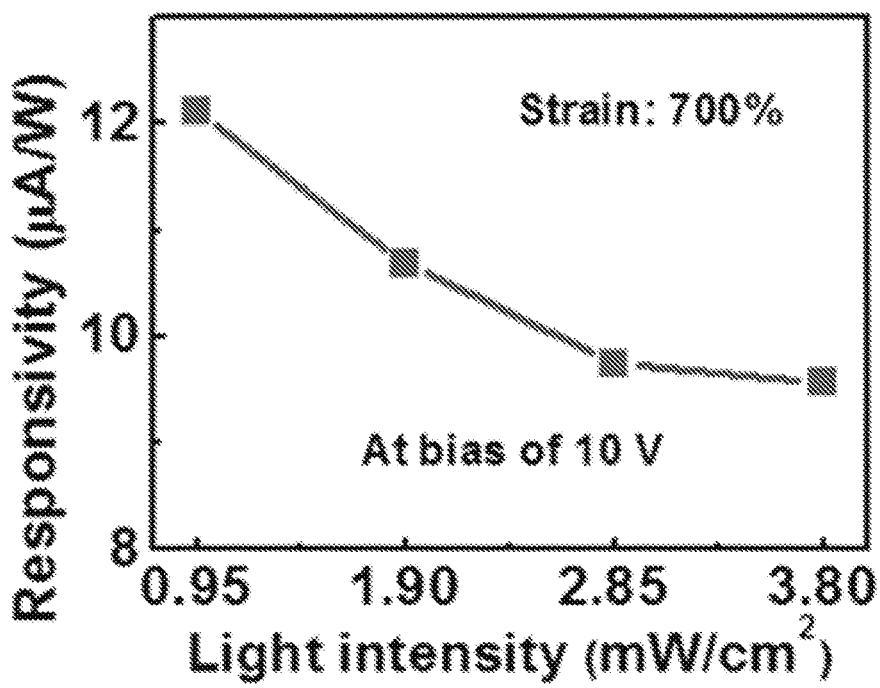
FIG. 8 is a graph of the responsivity (mA/W) of paper-based Zinc Oxide (ZnO) ultraviolet (UV) photodetector (PD) arrays with Miura-ori structures as function of UV light intensity (mW/cm$^2$) under a bias of 10 V at strain of 700%.

Moreover, the paper-based ZnO UV PDs further evolved into ultra-stretchable and flexible paper-based PD arrays by incorporating with Miura origami (the most unique property of paper substrates). FIG. 4 is a schematic diagram (the completely unfolding state) of paper-based ZnO UV PD arrays with Miura-ori structures, having base parallelogram faces (dashed fold line), carbon electrodes (black straight line) and series-parallel connected PD unit cells on the base parallelogram faces (white zones). Via origami folding techniques, the paper-based ZnO UV PD arrays with Miura-ori structures transform from two-dimensional sheets to three-dimensional forms (many identical parallelogram faces are connected by fold lines to form three-dimensional pyramids), as shown in FIG. 5. Notice that the parallelogram faces remain un-deformed because the folding and unfolding of the fold lines maintain the faces in a rigid configuration. At the same time, the strain (S) is defined by using the dimensions marked in FIG. 6 as, $S=[(L_x-I_{x0})/I_{x0}]\times 100\%$ for x direction. $L_x$ is the dimension for the unfold state and $I_{x0}$ is the dimension for the completely compressed state (i.e., $I_{x0}=1$ cm). In order to demonstrated the UV sensitivity of paper-based ZnO UV PD arrays at the unfolded state (strain: 700%), the I-V curves in the dark and under UV illumination with a light intensity of 3.8 mW/cm² at room temperature are shown in FIG. 7. The photocurrent of paper-based ZnO UV PD arrays is approximately one order of magnitude larger than the dark current under a bias of 10 V (i.e., the photo-to-dark current ratio (PDCR) is up to 13.4, using $PDCR=(I_p-I_d)/I_d$, where $I_d$ is the dark current and $I_p$ is the photocurrent under UV illumination)[37]. Moreover, as shown in FIG. 8, at the unfolded state (strain: 700%), the responsivity of paper-based ZnO UV PD arrays with Miura-ori structures decreases with increase UV light intensity under a bias of 10 V, echoing the results of FIG. 3.

To highlight the outstanding and stable UV light detection of paper-based ZnO UV PD arrays with Miura-ori structures, the following investigations were performed, including light sensing under stretching, bending and twisting processes, shown in FIGS. 9-18.

Figure 9:
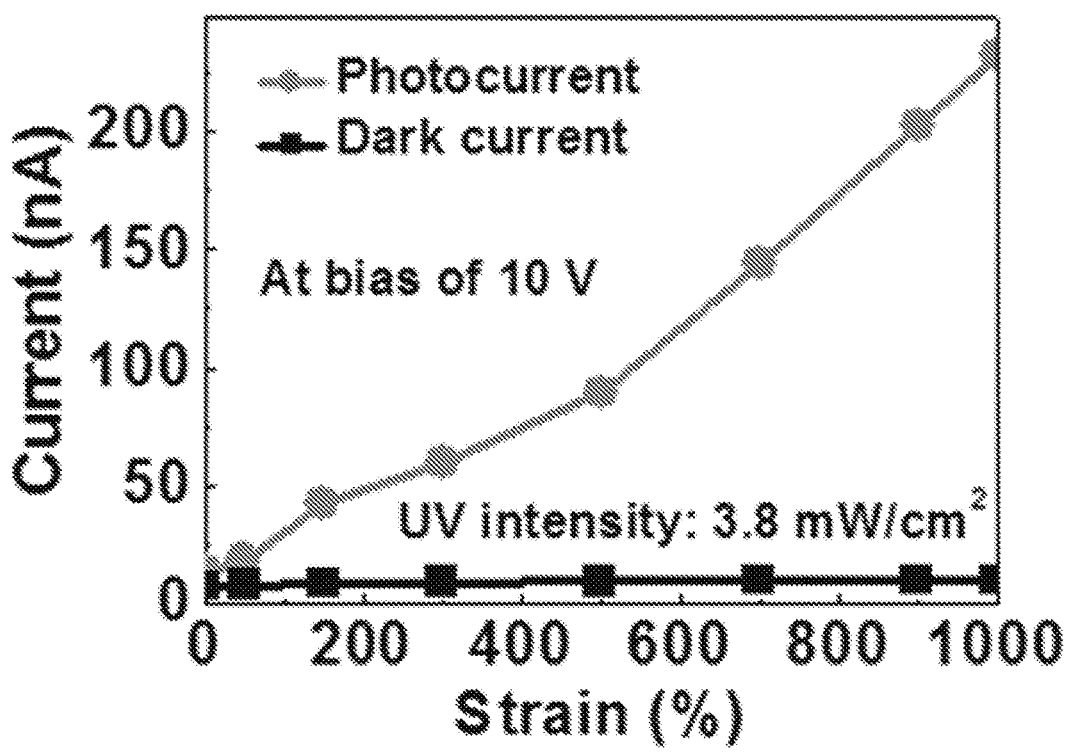
FIG. 9 is a graph of the dark current and photocurrent (nA) of paper-based Zinc Oxide (ZnO) ultraviolet (UV) photodetector (PD) arrays with Miura-ori structures as function of strain (% strain) measured in dark and under UV illumination with the light density of 3.8 mW/cm$^2$ at 10 V bias.
Figure 10:
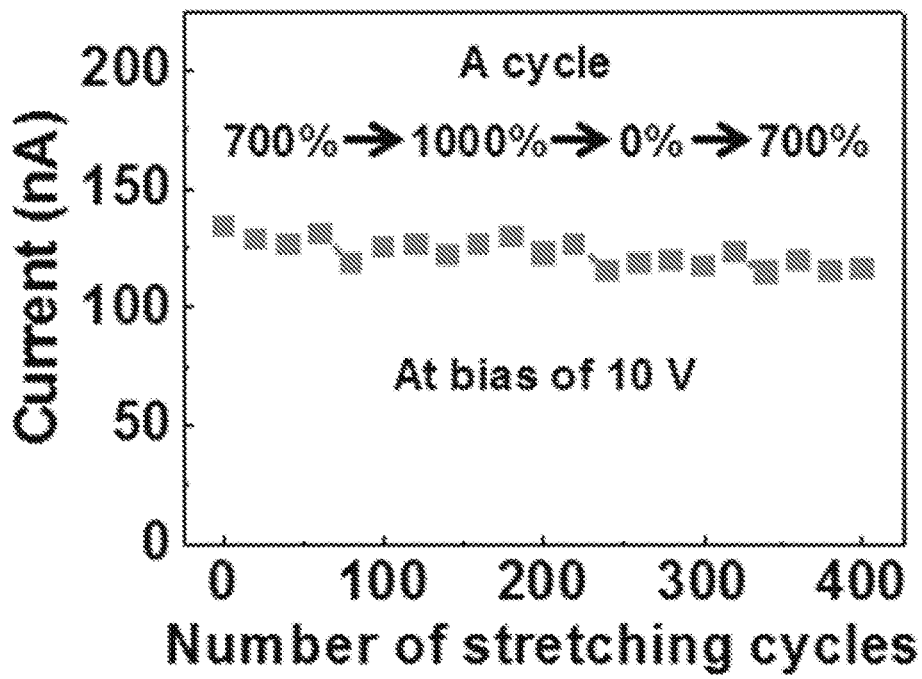
FIG. 10 is a graph of the photocurrent (nA) of paper-based Zinc Oxide (ZnO) ultraviolet (UV) photodetector (PD) arrays with Miura-ori structures as function of the number of stretching cycles measured under UV illumination with the light density of 3.8 mW/cm$^2$ at 10 V bias.

As shown in FIG. 9, the dark current and photocurrent curves of paper-based ZnO UV PD arrays with Miura-ori structures as function of strain were measured in the dark and under UV illumination with light intensity of 3.8 mW/cm2 at 10 V bias. From the folded to unfolded state, the photocurrent increases with increasing the strain due to more effective absorption of UV light in PD unit cells with transforming Miura-ori structures from three-dimensional forms to two-dimensional sheets under normal-incident illumination; the dark current is quite stable and showed no noticeable increase even under high stain. In addition, under strain up to 1000% and 400 linear stretching cycles, the variation of photocurrent is ultra-low, as shown in FIG. 10. This stable performance of paper-based ZnO UV PD arrays with Miura-ori structures can be attributed to the good quality bonding between carbon electrodes and series-parallel connected ZnO PD unit cells.

Figure 11:
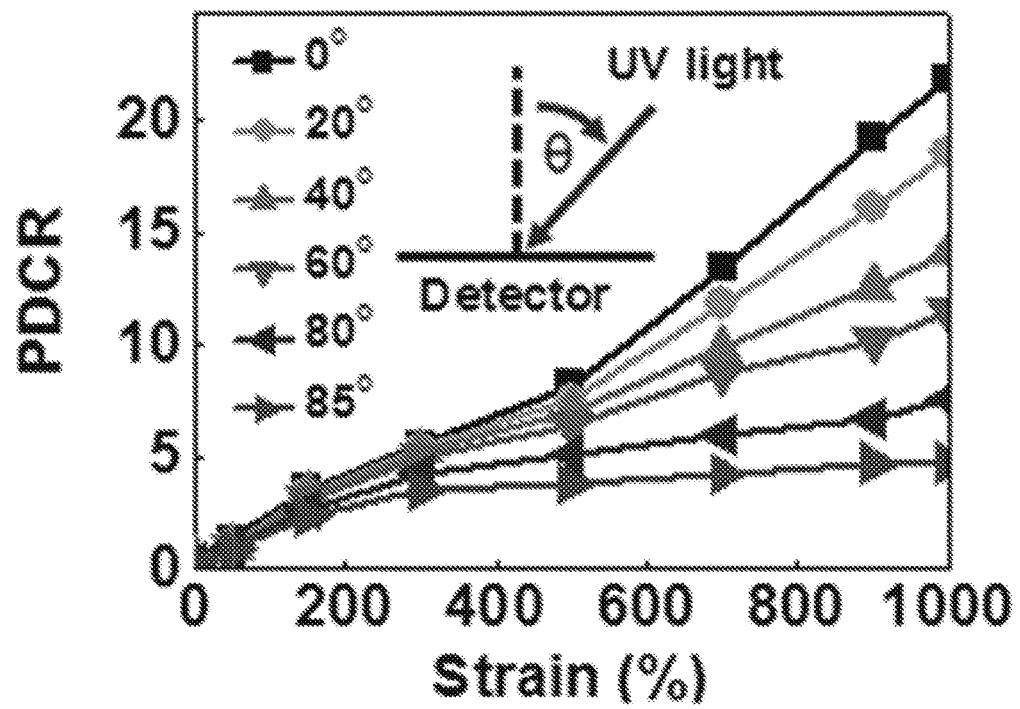
FIG. 11 is a graph of the photo-to-dark current ratio (PDCR) of paper-based Zinc Oxide (ZnO) ultraviolet (UV) photodetector (PD) arrays with Miura-ori structures as function of strain (% strain) at different angles of incidence (AOI) of UV light ranging from 0° 85°.
Figure 12:
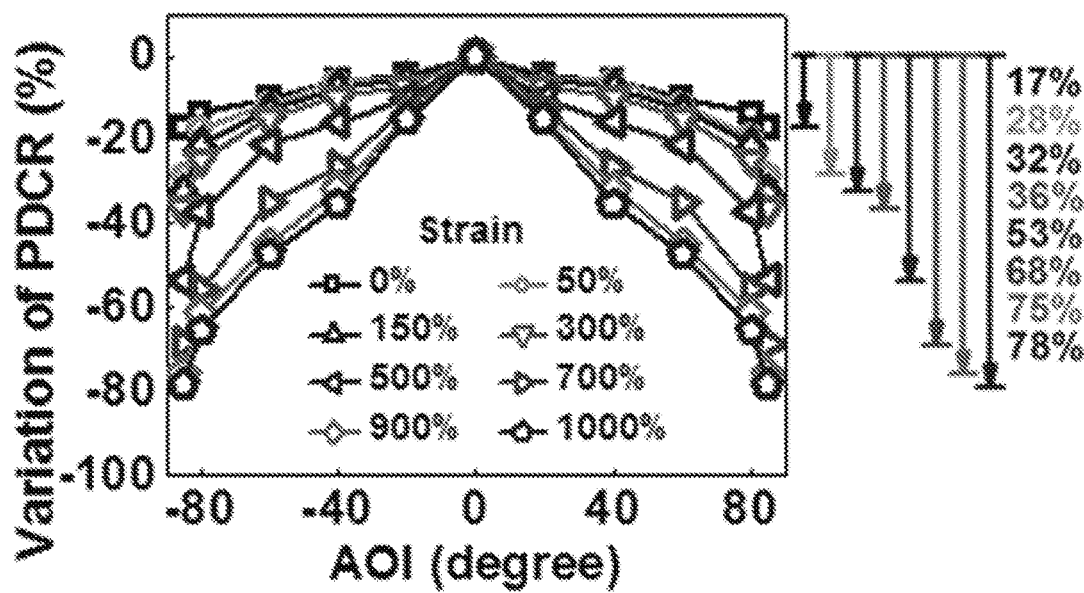
FIG. 12 is a graph of the percent deviation of the photo-to-dark current ratio (PDCR) (%) as a function of the angle of incidence (AOI) of paper-based Zinc Oxide (ZnO) ultraviolet (UV) photodetector (PD) arrays with Miura-ori structures under differing levels of percent strain ranging from 0% to 1000%. The percent deviation is computed relative to the PDCR at an AOI of zero degrees.
Figure 13:
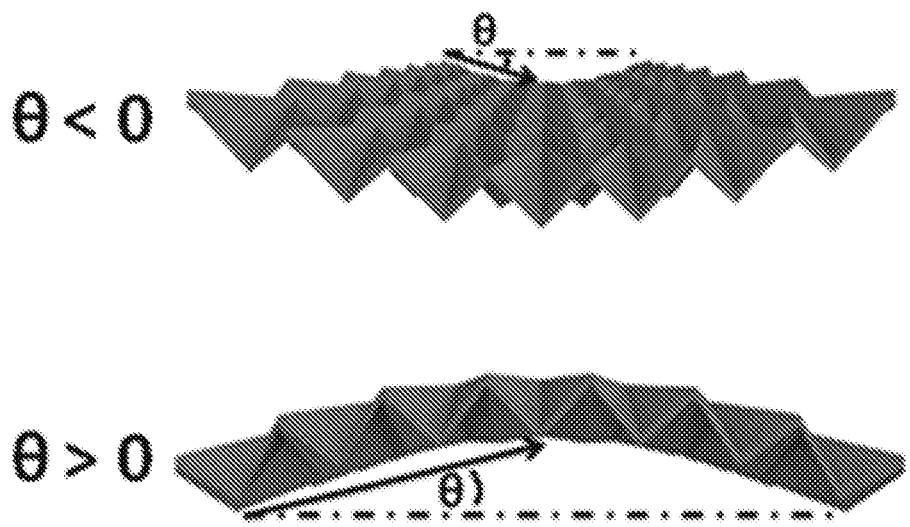
FIG. 13 is a schematic illustration of paper-based Zinc Oxide (ZnO) ultraviolet (UV) photodetector (PD) arrays with Miura-ori structures with concave up (bending angle θ<0) and down (bending angle θ<0) bending.
Figure 14:
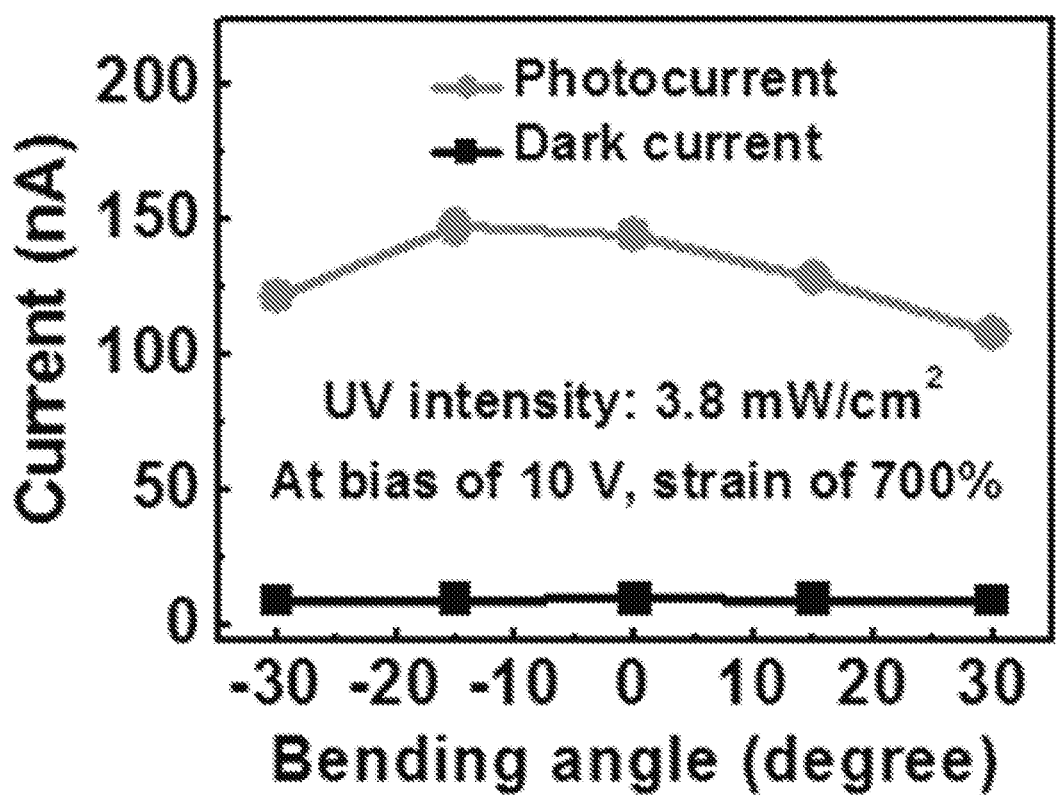
FIG. 14 is a graph of the photocurrent and dark current (nA) of paper-based Zinc Oxide (ZnO) ultraviolet (UV) photodetector (PD) arrays with Miura-ori structures under strain of 700% as a function of the bending angle (degrees).

Moreover, the PDCR of paper-based ZnO UV PD arrays with Miura-ori structures as function of strain at different AOI are shown in FIG. 11. Under high strain (1000%), the PDCR value decreases with the increase of AOI due to high reflection of light on the nearly plane surfaces (i.e., the totally unfolded state), In contrast, under low strain (<500%), the difference of PDCR value is very small (<5) over a wide range of AOI (from 0 to 85 degrees), indicating that paper-based ZnO UV PD arrays exhibits much better omnidirectional light detection under low strain (<500%). In order to further assess omnidirectional photodetection of paper-based ZnO UV PD arrays, we define the AOI-dependent variation of PDCR as $[(PDCR_\theta-PDCR_0)/PDCR_0]\times 100\%$, where $PDCR_\theta$ is the PDCR value at incident angle of θ, and $PDCR_0$ value is the PDCR value at normal incidence. As shown in FIG. 12, the AOI-dependent variation of PDCR under low strain (from 0% to 500%) is very small (between −20% and −40%) even at the largest angle of incidence (85°) as compared to under high strain (>500%), corresponding with the results of FIG. 11. Besides ultra-high in-plane stretchability, the stable electrical properties of paper-based ZnO UV PD arrays with Miura-ori structures also are demonstrated in the dark and under UV illumination with a light intensity of 3.8 mW/cm$^2$ via various bending and twisting processes. FIG. 13 illustrates the bending angle of paper-based ZnO UV PD arrays with Miura-ori structures, showing concave up (bending angle θ<0) and down (bending angle θ<0) bending in the upper and lower picture, respectively. The bending angle-dependent photocurrent and dark current of paper-based ZnO UV PD arrays with Miura-ori structures under strain of 700% are shown in FIG. 14.

Figure 15:
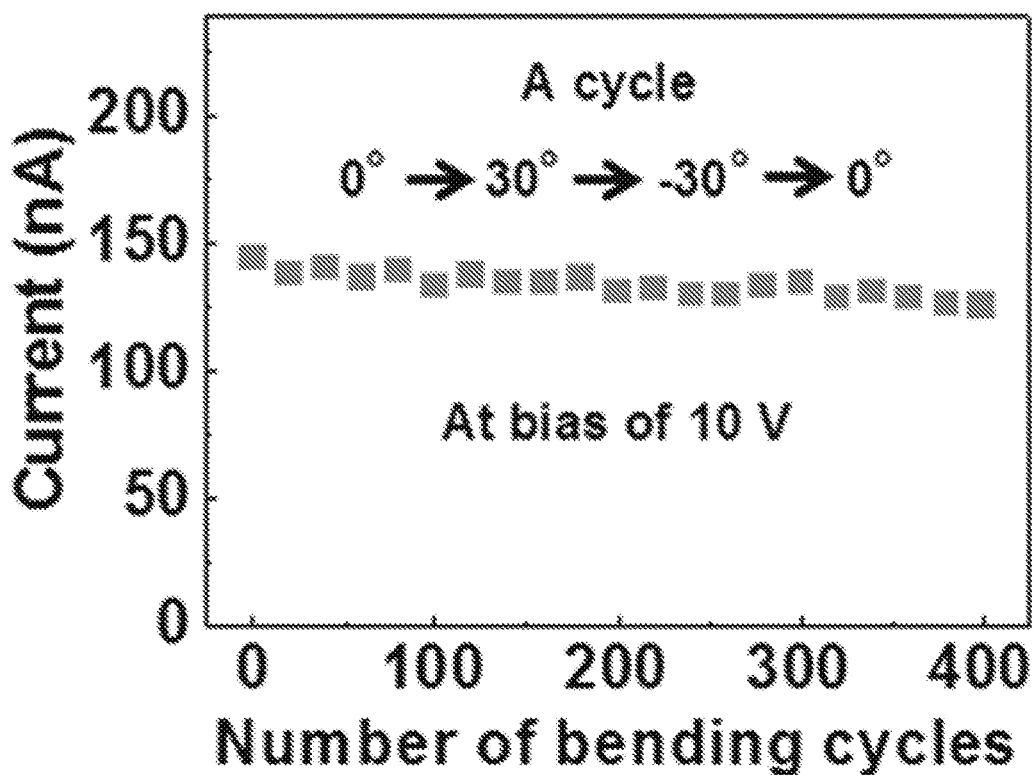
FIG. 15 is a graph of the photocurrent (nA) versus the number of bending cycles under a bias of 10 V and ultraviolet illumination with a light intensity of 3.8 mW/cm$^2$.

The paper-based ZnO UV PD arrays with Miura-ori structures exhibit a dark current as low as 9 nA and no sign of vibration at a bias up to 10 V during the complete bending processes (−30°≤θ≤30°). The PDCR values of paper-based ZnO UV PD arrays with Miura-ori structures are in the range of 11-13 during the completely bending processes, indicating that the variance of photocurrent is also very small under bending processes. Moreover, FIG. 15 shows the photocurrent versus bending cycles (from 0 to 400 cycles) under a bias of 10 V and UV illumination with a light intensity of 3.8 mW/cm$^2$, and photocurrent stability was repeatedly observed.

Figure 16:
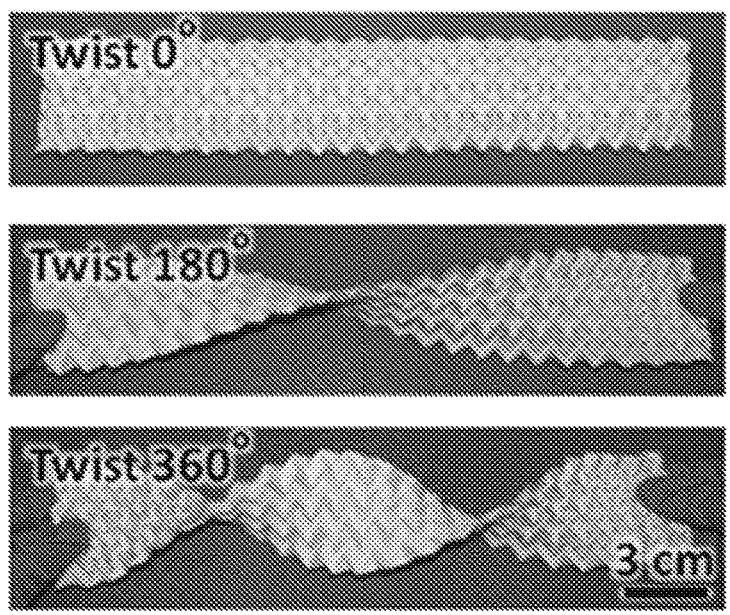
FIG. 16 is a photograph of paper-based Zinc Oxide (ZnO) ultraviolet (UV) photodetector (PD) arrays with Miura-ori structures subjected to torsions of (from top to bottom) 0° twist. 180° twist, and 360° twist.
Figure 17:
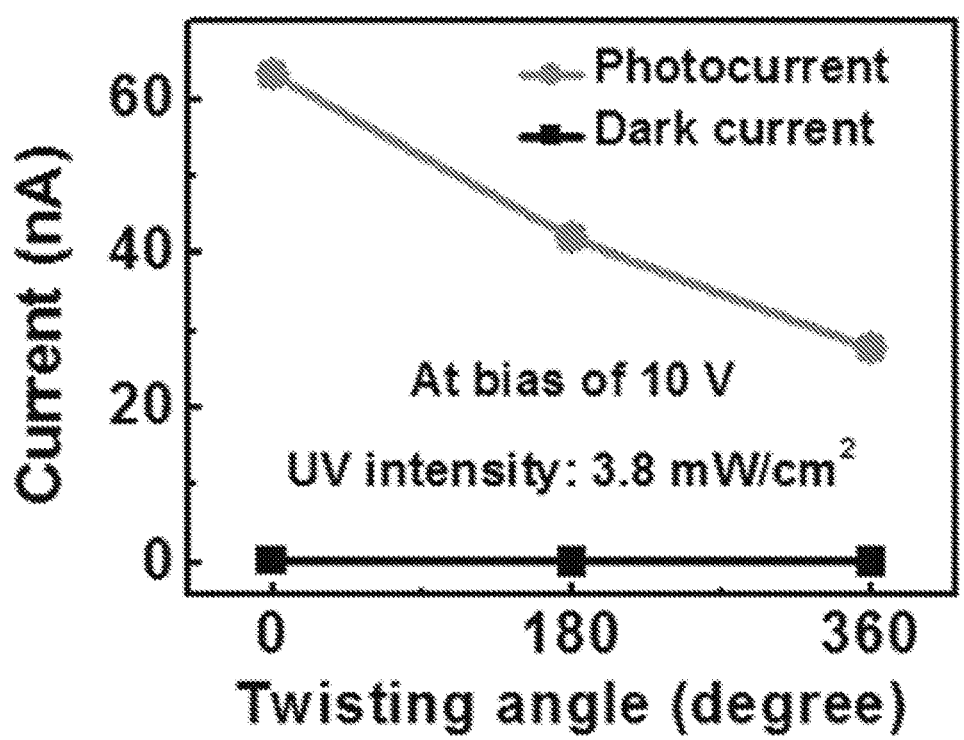
FIG. 17 is a graph of the dark current and photocurrent (nA) of paper-based Zinc Oxide (ZnO) ultraviolet (UV) photodetector (PD) arrays with Miura-ori structures versus twist angle (degrees) measured in the dark and under ultraviolet illumination with a light intensity of 3.8 mW/cm² at 10 V bias.
Figure 18:
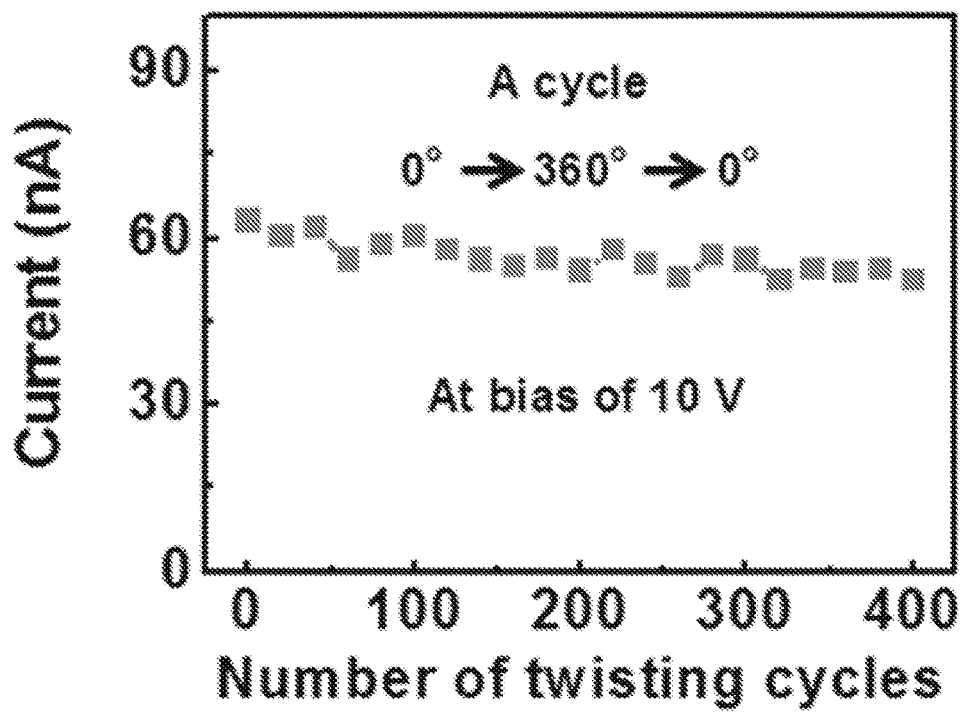
FIG. 18 is a graph of the photocurrent (nA) as a function of the number of twist cycles under a bias of 10 V and ultraviolet illumination with a light intensity of 3.8 mW/cm².
Figure 25:
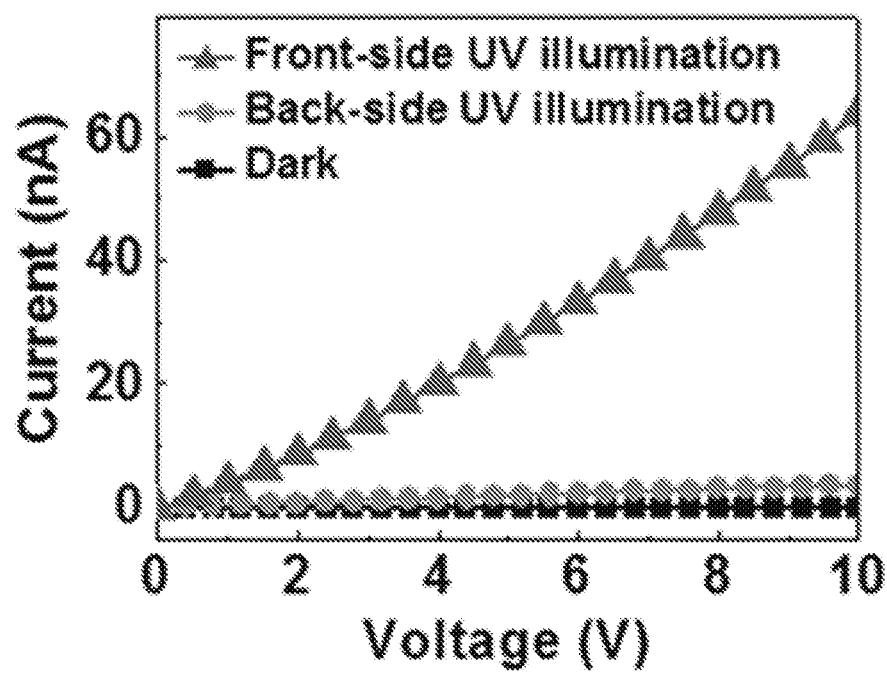
FIG. 25 is a current-voltage (I-V) curve of the photocurrent (nA) as a function of the voltage (V) of paper-based Zinc Oxide (ZnO) ultraviolet (UV) photodetector (PD) arrays with Miura-ori structures measured in the dark and under front-side and back-side ultraviolet (UV) illumination with a light intensity of 3.8 mW/cm².
Figure 26:
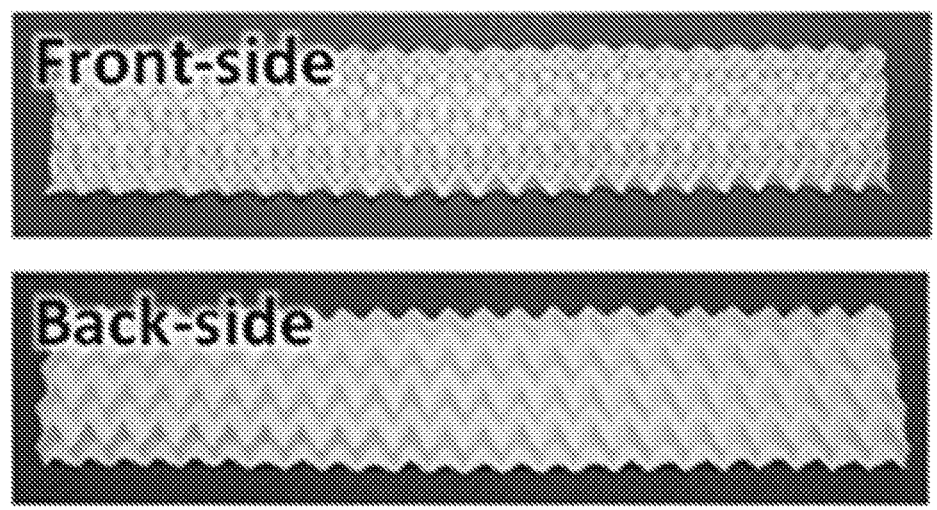
FIG. 26 is a photograph of paper-based Zinc Oxide (ZnO) ultraviolet (UV) photodetector (PD) arrays with Miura-ori structures with front-side view (upper photograph) and back-side view (lower photograph).
Figure 27:
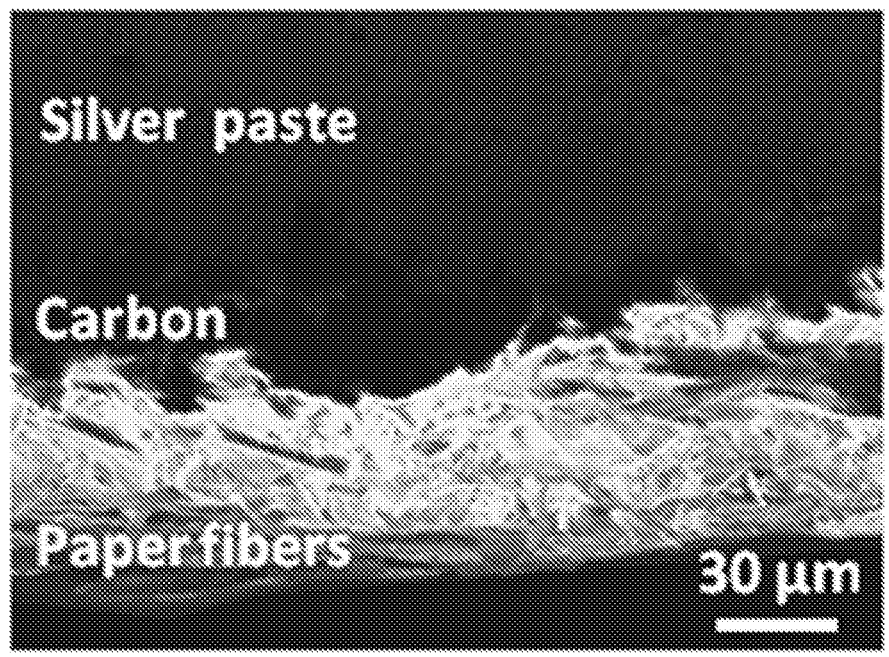
FIG. 27 is a cross-sectional scanning electron microscope (SEM) image of carbon electrodes of paper-based Zinc Oxide (ZnO) ultraviolet (UV) photodetector (PD) arrays before cyclic mechanical loads (400-cycles stretching, bending and twisting).
Figure 28:
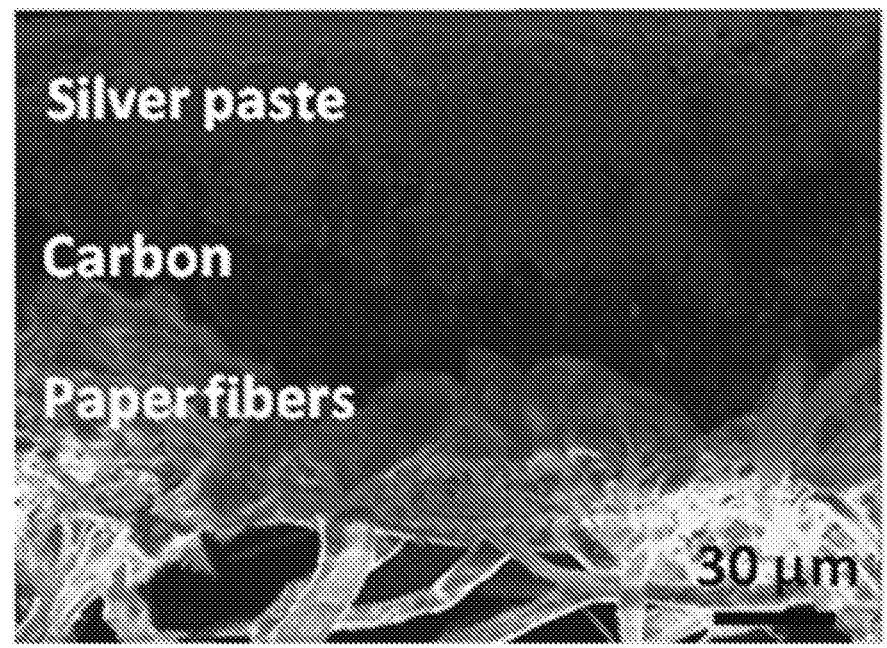
FIG. 28 is a cross-sectional scanning electron microscope (SEM) image of carbon electrodes of paper-based Zinc Oxide (ZnO) ultraviolet (UV) photodetector (PD) arrays after cyclic mechanical loads (400-cycles stretching, bending and twisting).

FIG. 16 is the optical photograph of paper-based ZnO UV PD arrays with Miura-ori structures subjected to torsion (the angle of twist: 0, 180 and 360 degrees) after tension and bending. To boost the high torsion endurance, the dark current and photocurrent of paper-based ZnO UV PD arrays with Miura-ori structures as a function of twist angle were measured in the dark and under UV illumination with a light intensity of 3.8 mW/cm$^2$, as shown in FIG. 17 It is clear that the paper-based ZnO UV PD arrays with Miura-ori structures still maintain low dark current (<10 nA) even under large torsion (the angle of twist up to 360 degree). However, some paper-based ZnO UV PD arrays with Miura-ori structures under front-side UV illumination were changed to back-side UV illumination by twist processes, leading to the degradation of the photocurrent as the twist angle increasing. As shown in FIG. 25 and FIG. 26, compared to front-side UV illumination, the photocurrent can be decreased by up to one order of magnitude at 10 V bias under back-side UV illumination. In addition, FIG. 18 shows the photocurrent of paper-based ZnO UV PD arrays with Miura-ori structures as a function of twist cycles (from 0 to 400 cycles) in which a similar stability to that for tension and bending was repeatedly observed. Note that there are no voids and cracks observed in carbon electrodes of paper-based ZnO UV PD arrays after cyclic mechanical loads (400-cycles stretching, bending and twisting), as shown in FIG. 27 and FIG. 28.

Figure 19:
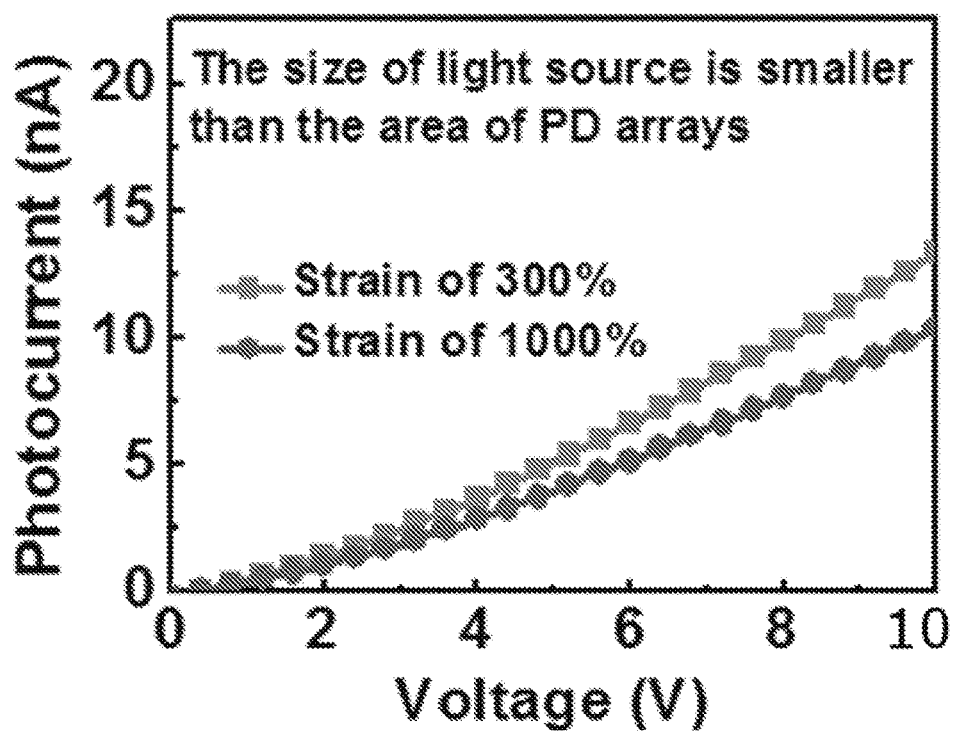
FIG. 19 is a current-voltage (I-V) curve of the photocurrent (nA) as a function of the voltage (V) of paper-based Zinc Oxide (ZnO) ultraviolet (UV) photodetector (PD) arrays with Miura-ori structures measured with strain of 300% and 1000% under UV illumination with the size of light source less than the area of PD arrays.
Figure 20:
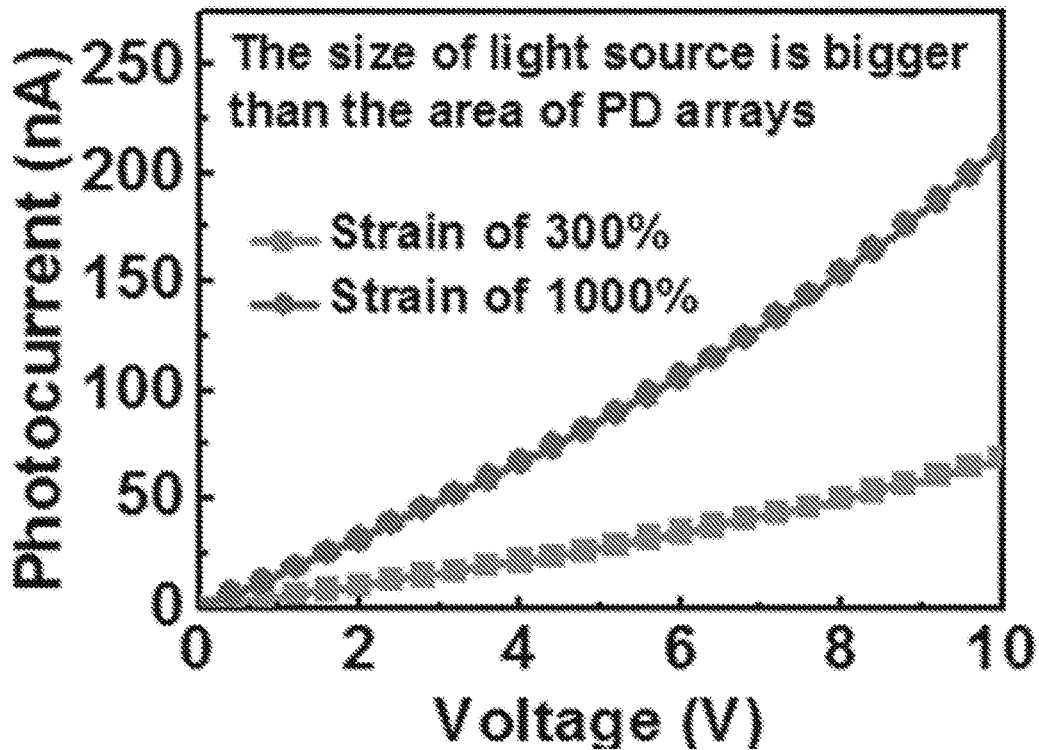
FIG. 20 is a current-voltage (I-V) curve of the photocurrent (nA) as a function of the voltage (V) of paper-based Zinc Oxide (ZnO) ultraviolet (UV) photodetector (PD) arrays with Miura-ori structures measured with strain of 300% and 1000% under UV illumination with the size of light source greater than the area of the PD arrays.
Figure 21:
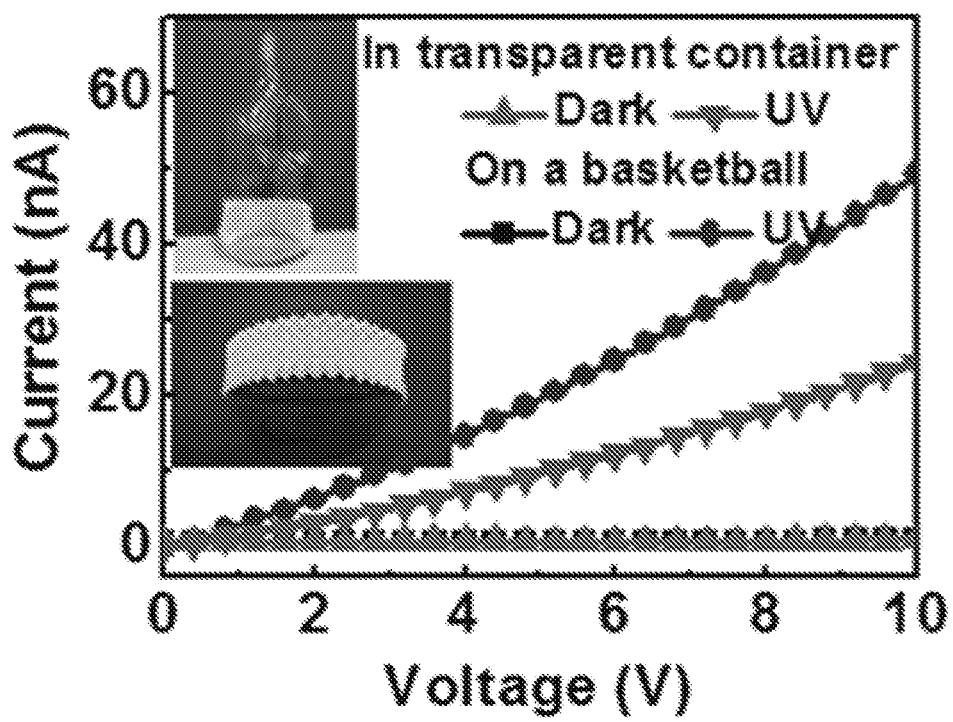
FIG. 21 is a current-voltage (I-V) curve of the photocurrent (nA) as a function of the voltage (V) of paper-based Zinc Oxide (ZnO) ultraviolet (UV) photodetector (PD) arrays with Miura-ori structures measured in the dark and under UV illumination with a light intensity of 3.8 mW/cm² with the PD arrays mounted on a basketball and on the inside of a transparent container (images in the insets).
Figure 22:
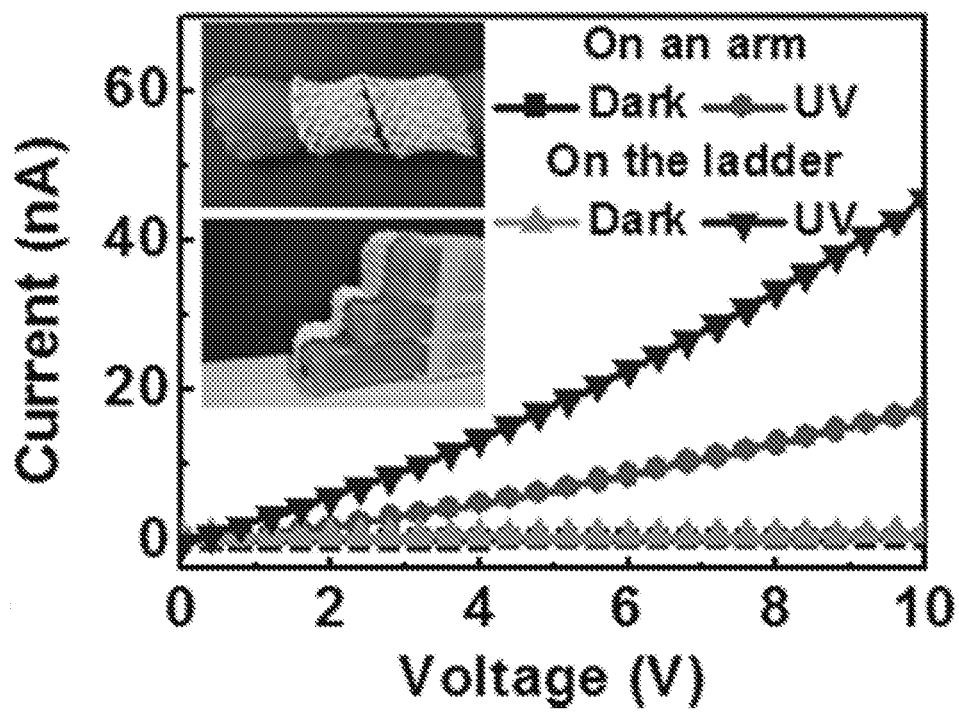
FIG. 22 is a current-voltage (I-V) curve of the photocurrent (nA) as a function of the voltage (V) of paper-based Zinc Oxide (ZnO) ultraviolet (UV) photodetector (PD) arrays with Miura-ori structures measured in the dark and under UV illumination with a light intensity of 3.8 mW/cm² with the PD arrays mounted on an arm and on a ladder structure (images in the insets).
Figure 29:
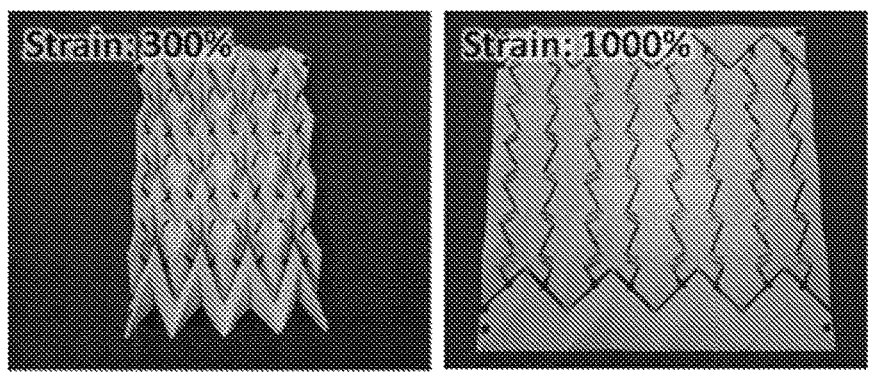
FIG. 29 is a photograph of paper-based Zinc Oxide (ZnO) ultraviolet (UV) photodetector (PD) arrays with Miura-ori structures measured with strain of 300% and 1000% under UV illumination with the size of light source less than the area of PD arrays.
Figure 30:
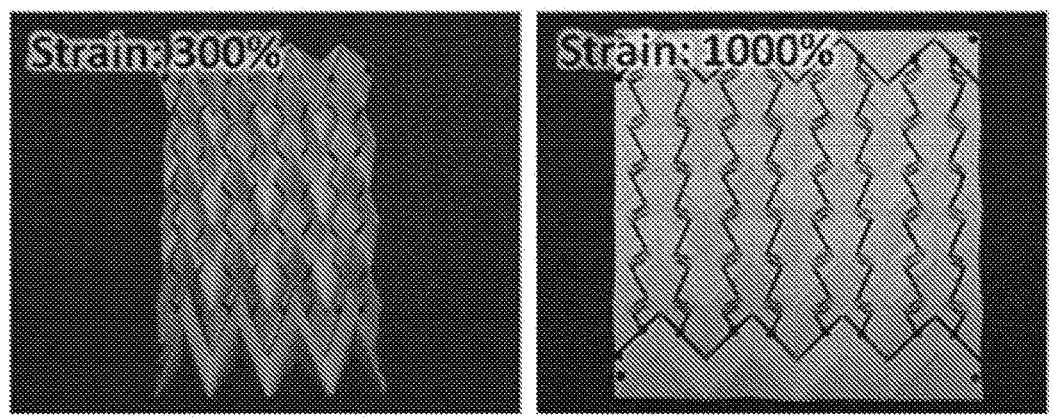
FIG. 30 is a photograph of paper-based Zinc Oxide (ZnO) ultraviolet (UV) photodetector (PD) arrays with Miura-ori structures measured with strain of 300% and 1000% under UV illumination with the size of light source greater than the area of PD arrays.
Figures 31, 31A, 31B:
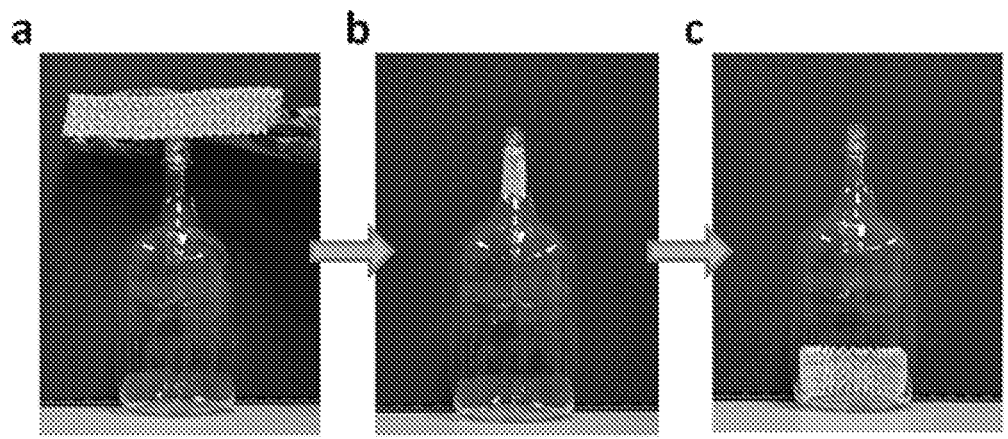

To further verify the capability of paper-based ZnO UV PD arrays with Miura-ori structures, six sets of the practical applications were demonstrated owing to various different sizes of light sources and curve surfaces in the actual images. As shown in FIG. 19, when the size of light source is smaller than the area of paper-based ZnO UV PD arrays with Miura-ori structures, the photocurrent under high strain (1000%) is lower than under low strain (300%) due to low ZnO PD unit cell density. By contrast, as the size of light source is bigger than the area of paper-based ZnO UV PD arrays with Miura-ori structures, the photocurrent under high strain (1000%) is higher than under low strain (300%) due to most ZnO PD unit cells under normal-incident illumination, as shown in FIG. 20. FIG. 29 and FIG. 30 show that the sizes of light sources are smaller (FIG. 29) and bigger (FIG. 30) than the area of paper-based ZnO UV PD arrays, respectively. As shown in FIG. 21 and FIG. 22, the dark and photocurrent current of paper-based ZnO UV PD arrays with Miura-ori structures were measured in the dark and under UV illumination after mounting on a basketball, in a transparent container, on an arm and on the ladder (i.e., at various high tension, flexure and torsion situations), respectively. In all of the above-mentioned situations, the photocurrent of paper-based ZnO UV PD arrays is approximately one order of magnitude larger than the dark current under a bias of 10 V (i.e., PDCR are up to 16 (on a basketball), 7.5 (in a transparent container), 5.2 (on an arm) and 14.7 (on the ladder)), indicating high stable photoresponse capability. It should be noted that paper-based ZnO UV PD arrays with Miura-ori structures can be mounted in the narrow-mouth containers easily due to the their ultra-high deformability, as shown in FIGS. 31A-31C.

Paper-based ZnO PD arrays employing screen printed methods and Miura-origami concepts with unprecedented deformability (such as stretching (strain: up to 1000%), bending (bending angle: >30°) and twisting (twist angle: up to 360°) were fabricated. In addition, at the highest angles of incidence (85°), the AOI-dependent variation of PDCR maintains low value (from −20% to −40%) under low strain (from 0% to 500%) as compared to under high strain (>500%), exhibiting the ultra-high omnidirectional property of paper-based ZnO UV PD arrays with Miura-ori structures. Furthermore, after 400-cycle tension, flexure and torsion testing, respectively, the paper-based ZnO UV PD arrays with Miura-ori structures show ultra-stable photoresponse, indicating that these PD arrays are suitable for the UV detection applications in varied particle conditions (e.g., different size of light sources, curve and uneven surfaces). This work demonstrates that ZnO UV PD arrays incorporated with low-cost paper substrates and Miura-origami art hold promise for the next-generation deformable optoelectronic applications.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim:

1. A deformable optoelectronic device comprising:
   a paper substrate comprising a plurality of fold segments arranged in a deformable pattern;
   first and second electrode layers attached to a surface of the substrate; and
   plural semiconductor nanowire layers configured to detect light and act as photodetectors,
   wherein the plural semiconductor nanowire layers are electrically connected, along parallel branches, between the first and second electrode layers, each branch including a subset of the plural semiconductor nanowire layers electrically connected in series, and
   wherein the substrate is folded along plural fold lines to form a 3-dimensional structure.

2. The optoelectronic device of claim 1, wherein the device is folded to undergo a strain of up to 500%.

3. The optoelectronic device of claim 1, wherein the device is folded to undergo a bending angle of up to 25°.

4. The optoelectronic device of claim 1, wherein the device is folded to undergo a twist angle of up to 270°.

5. The optoelectronic device of claim 1, wherein the first and second electrodes comprises a carbon electrode.

6. The optoelectronic device of claim 1, wherein each of the plural semiconductor nanowire layers comprises a semiconductor selected from the group consisting of zinc oxide (ZnO), copper oxide (CuO), barium carbonate ($BaCO_3$), bismuth oxide ($Bi_2O_3$), boron oxide ($B_2O_3$), calcium carbonate ($CaCO_3$), cerium oxide ($CeO_2$), chromium oxide ($Cr_2O_3$), iron oxide ($Fe_2O_3$), gallium oxide ($Ga_2O_3$), indium oxide ($In_2O_3$), lithium carbonate ($Li_2CO_3$), lithium cobalt oxide ($LiCoO_2$), magnesium oxide (MgO), manganese carbonate ($MnCO_3$), manganese oxide ($MnO_2$), manganese tetroxide ($Mn_3O_4$), niobium oxide ($Nb_2O_5$), lead oxide (PbO), antimony oxide ($Sb_2O_3$), tin oxide ($SnO_2$), strontium carbonate ($SrCO_3$), tantalum oxide ($Ta_2O_5$), titanium oxide ($TiO_2$), barium titanate ($BaTiO_3$), vanadium oxide ($V_2O_5$), tungsten oxide ($WO_3$), zirconium oxide ($ZrO_2$), gallium nitride (GaN), aluminum gallium nitride ($Al_xGa_{1-x}N$), silicon carbide (SiC), and zinc sulfide (ZnS).

7. The optoelectronic device of claim 1, wherein each of the plural semiconductor nanowire layers is formed on a corresponding fold segment of the plurality of fold segments.

8. The optoelectronic device of claim 1, wherein each of the plural semiconductor nanowire layers is a monolayer.

9. The optoelectronic device of claim 1, wherein each of the semiconductor nanowire layers has a thickness of about 20 µm to 200 µm.

10. The optoelectronic device of claim 1, wherein each of the fold segments is a parallelogram.

11. The optoelectronic device of claim 1, wherein the fold segments form a tessellation of the substrate surface.

12. The optoelectronic device of claim 1, wherein the first and second electrode layers comprises a plurality of interconnects connecting each of the fold segments to one or more adjacent fold segments.

13. The optoelectronic device of claim 1, wherein the deformable pattern is a Miura origami pattern.

14. A method of making a deformable optoelectronic device, the method comprising:
    applying an electrode material to a surface of a paper substrate to form first and second electrode layers attached to the surface of the paper substrate;
    applying a semiconductor nanowire to the surface of the paper and at least a portion of the electrode layer to form plural semiconductor nanowire layers that detect light and act as photodetectors, wherein the plural semiconductor nanowire layers are electrically connected, along parallel branches, between the first and second electrode layers, each branch including a subset of the plural semiconductor nanowire layers electrically connected in series; and
    creating a plurality of fold segments in the paper substrate to form a deformable pattern, and folding the substrate along a plurality of fold lines to form a 3-dimensional structure.

15. The method of claim 14, wherein the step of applying the electrode material comprises screen printing at least one electrode material on the surface of the paper substrate.

16. The method of claim 14, wherein the step of applying a semiconductor nanowire comprises making an ink comprising the semiconductor nanowire and painting the ink onto the surface of the paper substrate to form the plural semiconductor nanowire layers.

17. The method of claim 14, wherein the creating a plurality of fold segments comprises creating the plurality of fold lines including both mountain folds and valley folds to form the deformable pattern.

18. A method of detecting a photon, the method comprising:
    applying a bias voltage to a deformable optoelectronic device, wherein the deformable optoelectronic device includes,
    a paper substrate comprising a plurality of fold segments arranged in a deformable pattern;
    first and second electrode layers attached to a surface of the substrate; and
    plural semiconductor nanowire layers configured to detect light and act as photodetectors,
    wherein the plural semiconductor nanowire layers are electrically connected, along parallel branches, between the first and second electrode layers, each branch including a subset of the plural semiconductor nanowire layers electrically connected in series, and
    wherein the substrate is folded along the fold segments to form a 3-dimensional structure;
    impacting one of the plural semiconductor nanowire layers in the device with the photon; and
    detecting a current in first and second electrode layers of the device in response to the photon impacting one of the plural semiconductor nanowire layers.

19. The method of claim 18, wherein the light is ultraviolet light.

20. The method of claim 18, wherein the current is from 1 nA to 250 nA.

* * * * *